US012588520B2

(12) United States Patent
Futamura et al.

(10) Patent No.: US 12,588,520 B2
(45) Date of Patent: Mar. 24, 2026

(54) ELECTRONIC DEVICE AND METHOD FOR MANUFACTURING ELECTRONIC DEVICE

(71) Applicant: ROHM CO., LTD., Kyoto (JP)

(72) Inventors: Yosui Futamura, Kyoto (JP);
Masahiko Nakamura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 923 days.

(21) Appl. No.: 17/792,931

(22) PCT Filed: Jan. 18, 2021

(86) PCT No.: PCT/JP2021/001480
§ 371 (c)(1),
(2) Date: Jul. 14, 2022

(87) PCT Pub. No.: WO2021/149637
PCT Pub. Date: Jul. 29, 2021

(65) Prior Publication Data
US 2023/0094354 A1      Mar. 30, 2023

(30) Foreign Application Priority Data

Jan. 23, 2020      (JP) ................................. 2020-008918

(51) Int. Cl.
*H01L 23/495* (2006.01)
*H01L 23/00* (2006.01)

(52) U.S. Cl.
CPC .. *H01L 23/49513* (2013.01); *H01L 23/49548* (2013.01); *H01L 24/29* (2013.01);
(Continued)

(58) Field of Classification Search
CPC ......... H01L 23/49513; H01L 23/49548; H01L 24/29; H01L 24/32; H01L 24/48;
(Continued)

(56) References Cited

U.S. PATENT DOCUMENTS

2004/0046253 A1*    3/2004    Newman ................. H01L 24/29
                                                            257/734
2005/0208701 A1*    9/2005    Jeong .................. H01L 23/3128
                                                            257/E21.705
(Continued)

FOREIGN PATENT DOCUMENTS

JP          2000-277679 A       10/2000
JP          2005-516399 A        6/2005
JP           2019-29662 A        2/2019

OTHER PUBLICATIONS

International Search Report issued in PCT/JP2021/001480, Apr. 13, 2021 (3 pages).
(Continued)

*Primary Examiner* — Robert G Bachner
(74) *Attorney, Agent, or Firm* — HSML P.C.

(57) ABSTRACT

An electronic device which can suppress peeling off and damaging of the bonding material is provided. The electronic device includes an electronic component, a mounting portion, and a bonding material. The electronic component has an element front surface and an element back surface separated in the z-direction. The mounting portion has a mounting surface opposed to the element back surface on which the electronic component is mounted. The bonding material bonds the electronic component to the mounting portion. The bonding material includes a base portion and a fillet portion. The base portion is held between the electronic component and the mounting portion in the z-direction. The fillet portion is connected to the base portion and is formed outside the electronic component when seen in the z-direction. The electronic component includes two element lateral surface and ridges. The ridges are intersections of the two element lateral surface and extend in the z-direction. The fillet portion includes a ridge cover portion which covers at least a part of the ridges.

19 Claims, 20 Drawing Sheets

(52) U.S. Cl.
CPC .............. *H01L 24/32* (2013.01); *H01L 24/48*
(2013.01); *H01L 24/73* (2013.01); *H01L 24/83*
(2013.01); *H01L 2224/29139* (2013.01); *H01L*
*2224/3201* (2013.01); *H01L 2224/32053*
(2013.01); *H01L 2224/32056* (2013.01); *H01L*
*2224/32058* (2013.01); *H01L 2224/32059*
(2013.01); *H01L 2224/32245* (2013.01); *H01L*
*2224/48245* (2013.01); *H01L 2224/73263*
(2013.01); *H01L 2224/8384* (2013.01); *H01L*
*2924/182* (2013.01)

(58) Field of Classification Search
CPC ..................... H01L 24/73; H01L 24/83; H01L
2224/29139; H01L 2224/3201; H01L
2224/32053; H01L 2224/32056; H01L
2224/32058; H01L 2224/32059; H01L
2224/32245; H01L 2224/48245; H01L
2224/73263; H01L 2224/8384; H01L
2924/182; H01L 23/49541; H01L
23/3107; H01L 24/05; H01L 24/06; H01L
24/45; H01L 24/49; H01L 2224/04026;
H01L 2224/04042; H01L 2224/05599;
H01L 2224/0603; H01L 2224/06135;
H01L 2224/29015; H01L 2224/29019;
H01L 2224/291; H01L 2224/29199;
H01L 2224/29339; H01L 2224/29347;
H01L 2224/2939; H01L 2224/45124;
H01L 2224/45144; H01L 2224/45147;
H01L 2224/48091; H01L 2224/83439;
H01L 2224/83455; H01L 2224/83862;
H01L 2224/85444; H01L 2924/15747;
H01L 23/562; H01L 2224/05554; H01L
2224/06181; H01L 2224/48247; H01L
2224/49171; H01L 2224/73265; H01L
2224/83192; H01L 2224/83194; H01L
2224/92247; H01L 2924/181
See application file for complete search history.

(56) References Cited

U.S. PATENT DOCUMENTS

2012/0322205 A1*  12/2012  Nakamura .......... H01L 21/4853
                                                        438/108
2018/0040530 A1*  2/2018  Mahler ................... H01L 24/29

OTHER PUBLICATIONS

Office Action issued in in the corresponding Japanese Patent application No. 2021-572719, Sep. 17, 2024, and machine translation (10 pages).
Office Action issued in corresponding Chinese Patent application No. 202180010467.2, Jun. 20, 2025, and machine translation (16 pages).

* cited by examiner

ELECTRONIC DEVICE AND METHOD FOR MANUFACTURING ELECTRONIC DEVICE

TECHNICAL FIELD

The present disclosure relates to an electronic device and a manufacturing method of the electronic device.

BACKGROUND ART

Patent Document 1 discloses an example of the conventional electronic device. The electronic device of Patent Document 1 is provided with an electronic component, a lead frame, and a bonding material. Regarding the electronic device, the electronic component is a semiconductor element. The lead frame includes a mounting portion on which the electronic component is mounted. The mounting portion is a portion called an island or a die pad. The bonding material bonds the electronic component to the mounting portion. As for the bonding material, silver paste, for example, is used.

PRIOR ART DOCUMENTS

Patent Document

Patent Document 1: JP-A-2000-277679

SUMMARY OF INVENTION

Problem to be Solved by Invention

As to the above electronic device, the electronic component generates heat by energization. Due to this heat, a heat stress originated from the difference of the linear expansion coefficient between the electronic component and the mounting portion (lead frame) is applied onto the bonding material. As a result, there is a case where the bonding material is peeled off from the mounting portion, or the bonding material is damaged (for example, by a generation of a crack). These peeling and damaging cause deterioration of conductivity and deterioration of heat-emission of the electronic device.

In the light of the foregoing, the present disclosure has been conceived, and is directed to providing an electronic device capable of suppressing the peeling and the damaging of the bonding material. Further, it is directed to providing a method for manufacturing an electronic device capable of suppressing the peeling and the damaging of the bonding material.

Solution to Problem

An electronic device as to the first aspect of the present disclosure, includes: an electronic component having an element front surface and an element back surface separated from each other in a thickness direction; a mounting portion which has a mounting surface opposed to the element back surface and on which the electronic component is mounted; and a bonding material to bond the electronic component to the mounting portion, wherein the bonding material includes a base portion held between the electronic component and the mounting portion in the thickness direction, and a fillet portion connected to the base portion and formed outside the electronic component when seen in the thickness direction, wherein the electronic component includes a first element lateral surface and a second element lateral surface each of which is continuous to the element front surface and the element back surface, and a ridge which is an intersection of the first element lateral surface and the second element lateral surface and extends in the thickness direction, and wherein the fillet portion includes a ridge cover portion which at least covers a part of the ridge.

A method for manufacturing an electronic device includes an electronic component having an element front surface and an element back surface separated from each other in a thickness direction, a mounting portion which has a mounting surface opposed to the element back surface and on which the electronic component is mounted, and a bonding material to bond the electronic component to the mounting portion, according to the second aspect of the present disclosure, the method includes: an application process of applying a paste-like bonding material to the mounting surface; a placement process of arranging the electronic component on the paste-like bonding material; and a curing process of curing the paste-like bonding material and forming the bonding material, wherein the mounting portion includes the bonding region to which the electronic component is bonded, wherein the bonding region includes a corner portion overlapped with corners of the electronic component when seen in the thickness direction, and wherein the paste-like bonding material is applied starting from a central part of the electronic component toward the corner portion at least up until the corner portion.

Technical Effects

According to the electronic device of the present disclosure, the peeling and the damaging of the bonding material can be suppressed, for example. Further, according to the method for manufacturing the electronic device of the present disclosure, the electronic device on which the peeling and the damaging of the bonding material are suppressed can be manufactured.

MODE FOR CARRYING OUT THE INVENTION

Figure 1:
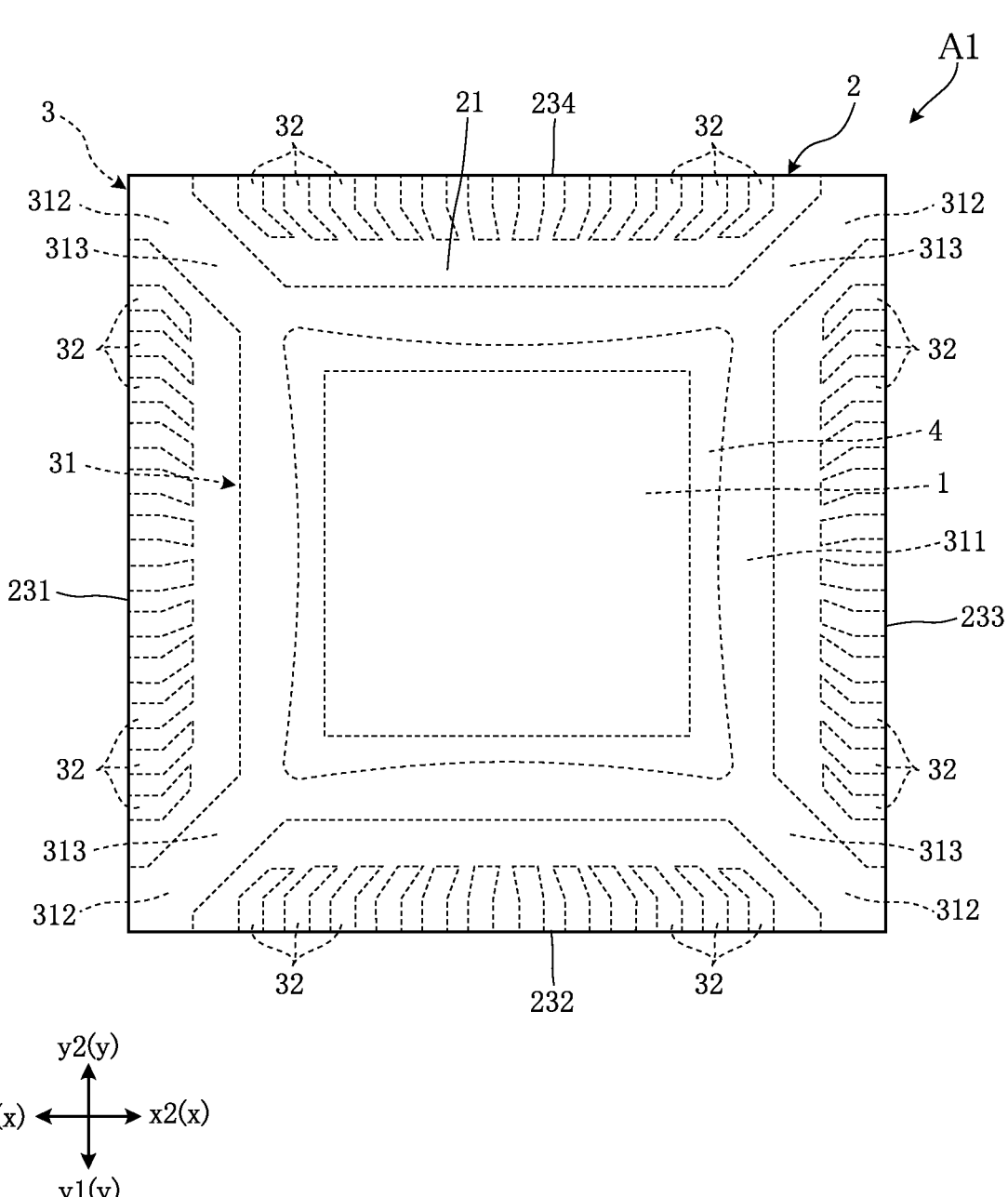
FIG. 1 is a plan view which shows an electronic device according to an embodiment.

A preferred embodiment of an electronic device and a method for manufacturing the electronic device of the present disclosure is explained below, with reference to drawings.

FIGS. 1-11 show an electronic device A1 according to an embodiment. The electronic device A1 has, for example, a package structure called a QFN (Quad Flat Non-leaded package). The electronic device A1 is implemented by a circuit substrate such as an electronic equipment. The electronic device A1 is rectangular in a plan view, for example. The electronic device A1 is provided with an electronic component 1, a resin member 2, a lead frame 3, a bonding material 4, and a plurality of connection members 5.

Figure 2:
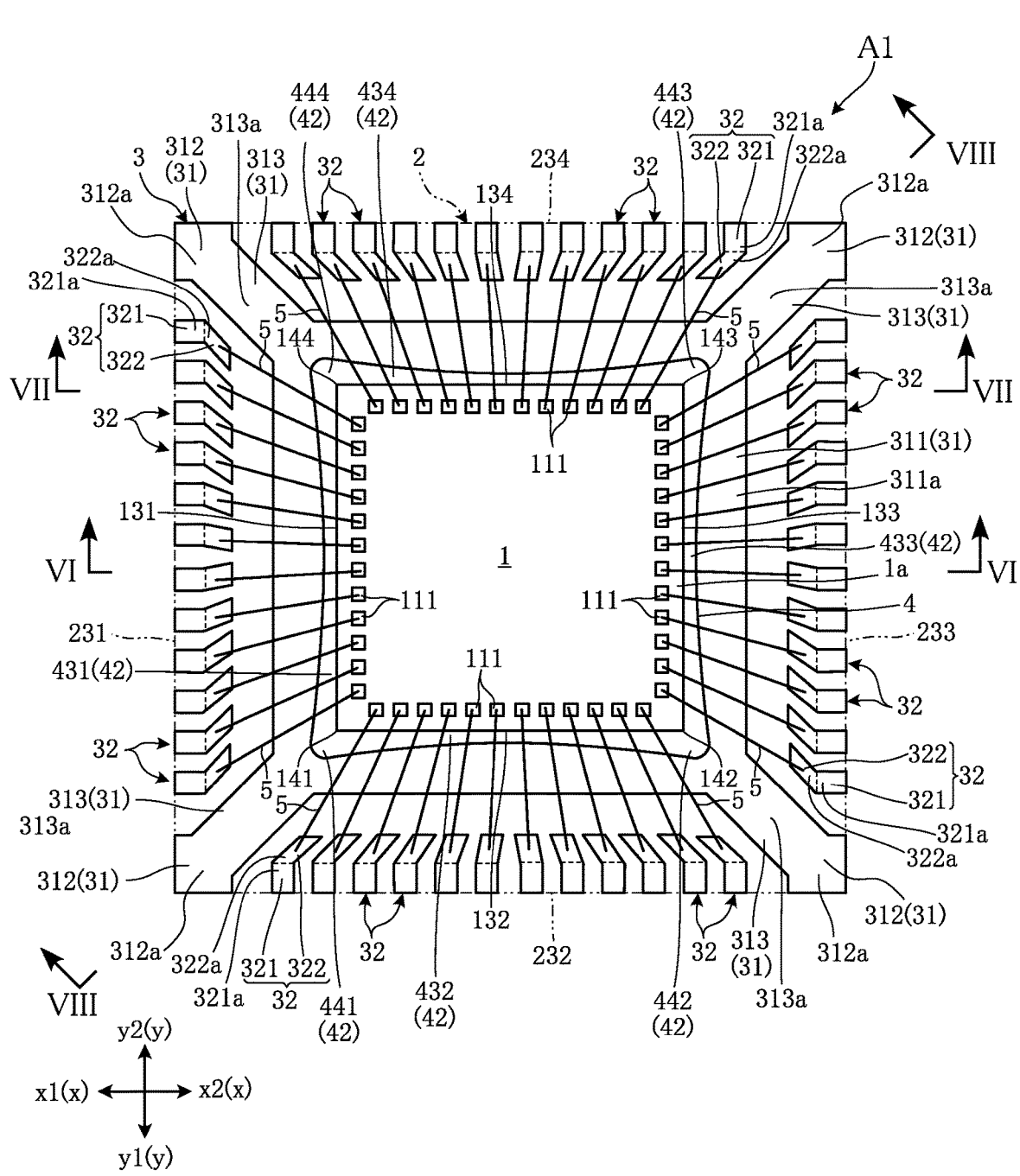
FIG. 2 is a view in which a resin member 2 is drawn by imaginary lines in FIG. 1.
Figure 3:
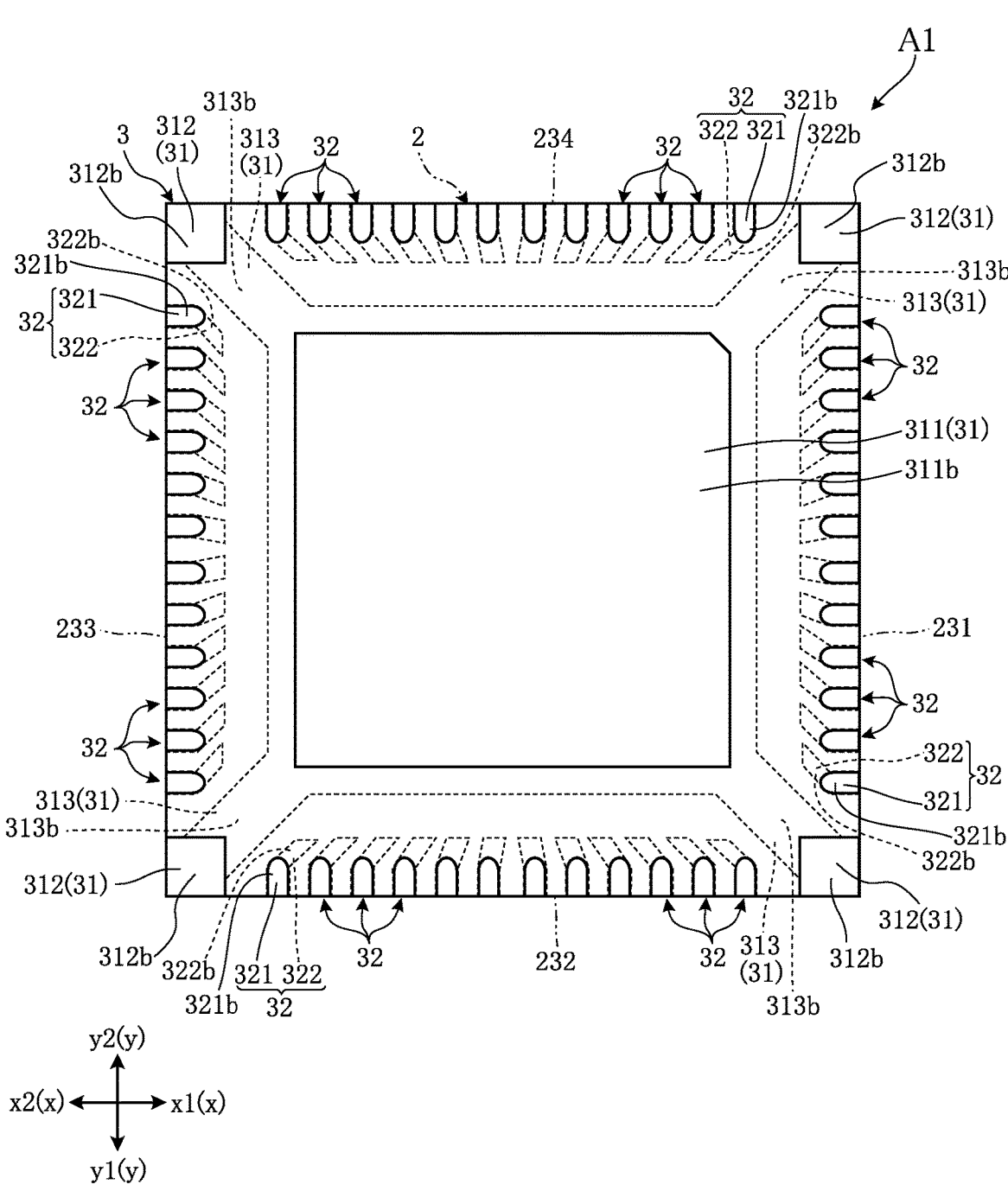
FIG. 3 is a bottom view which shows an electronic device according to an embodiment.
Figure 4:
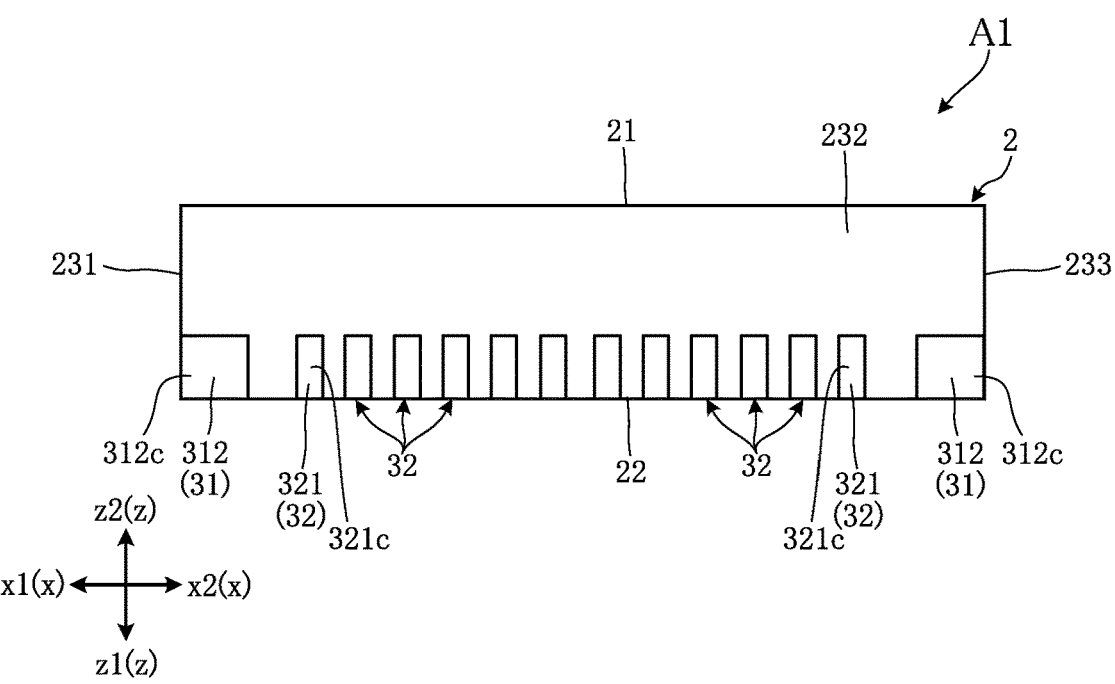
FIG. 4 is a front view which shows an electronic device according to an embodiment.
Figure 5:
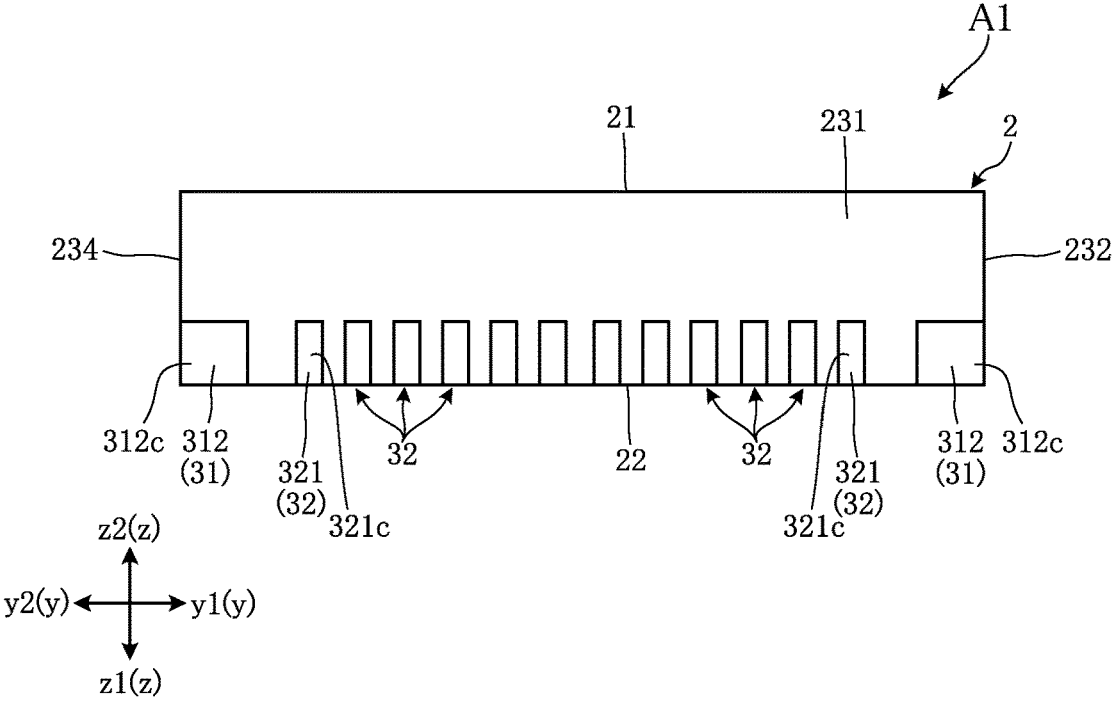
FIG. 5 is a lateral view (left side view) which shows an electronic device according to an embodiment.
Figure 6:
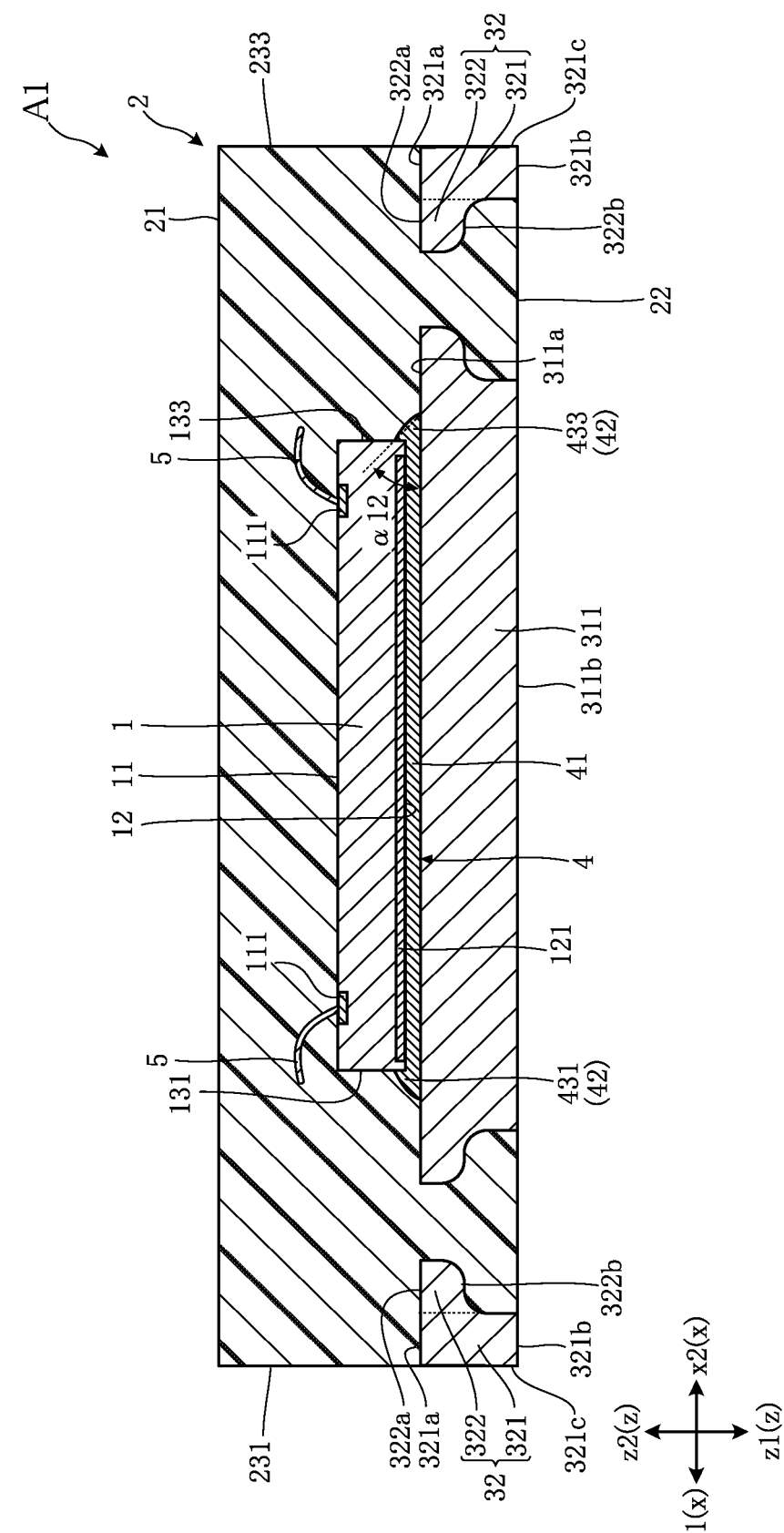
FIG. 6 is a cross sectional view along line VI-VI of FIG. 2.
Figure 7:
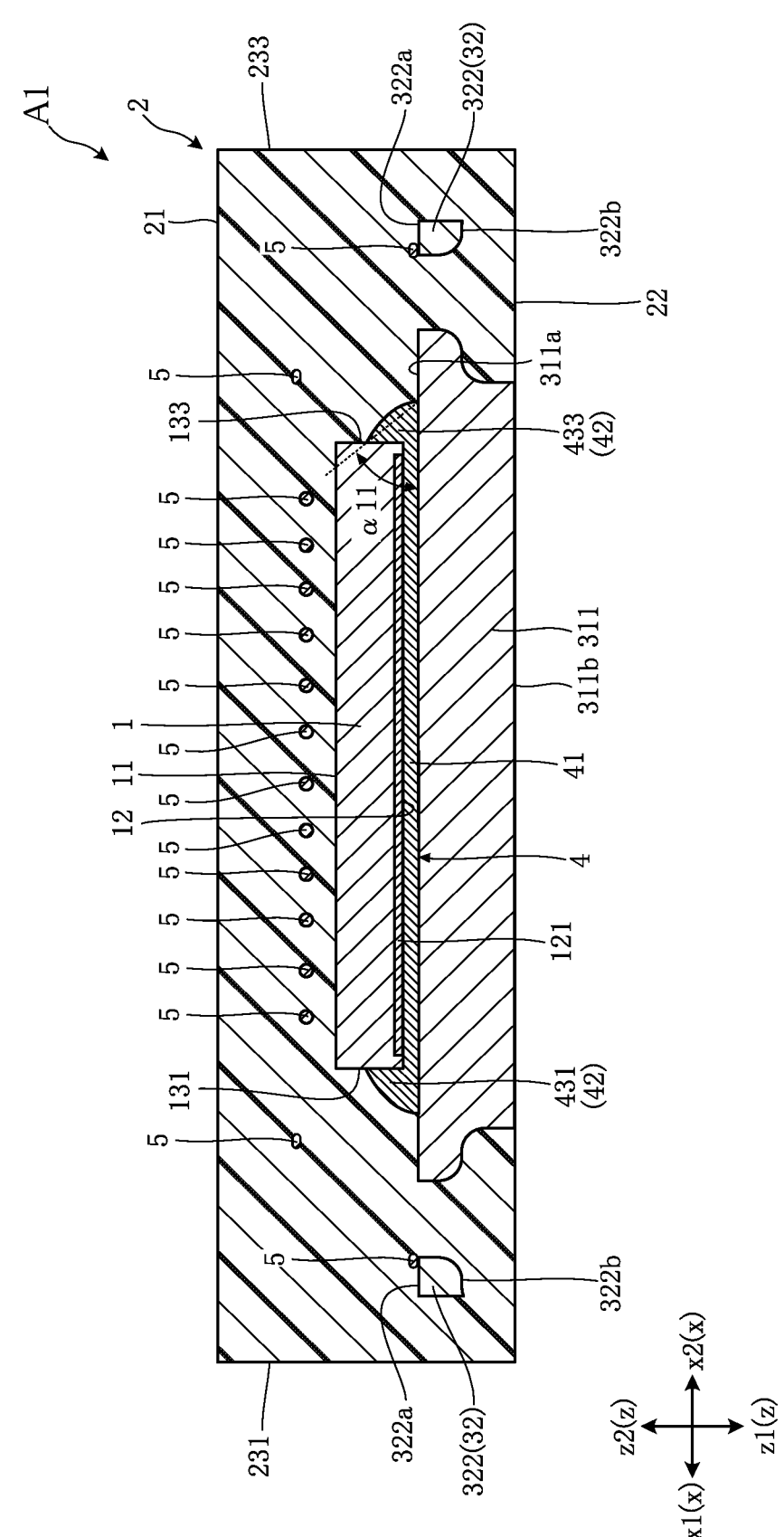
FIG. 7 is a cross sectional view along line VII-VII of FIG. 2.
Figure 8:
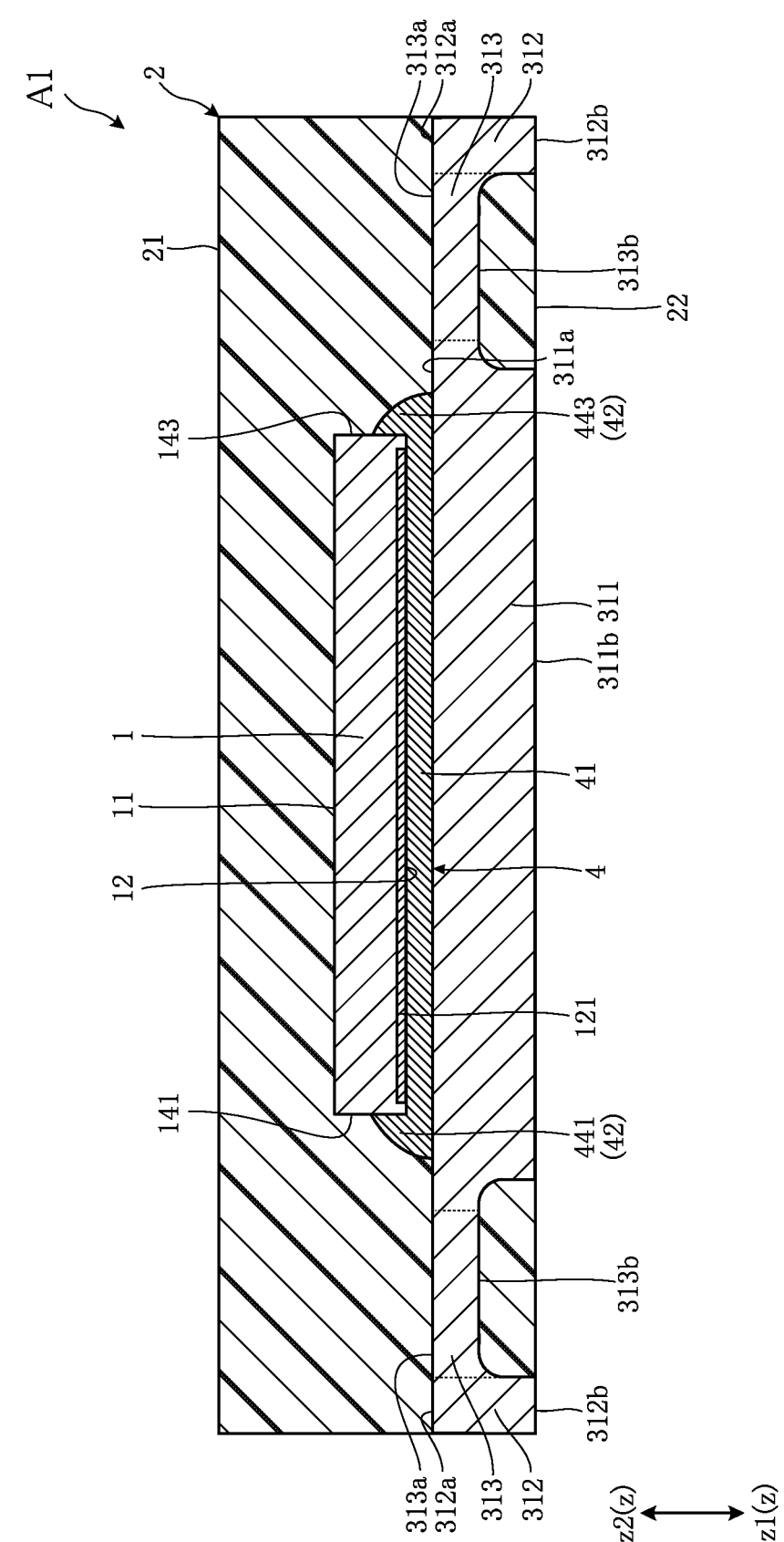
FIG. 8 is a cross sectional view along line VIII-VIII of FIG. 2.
Figure 9:
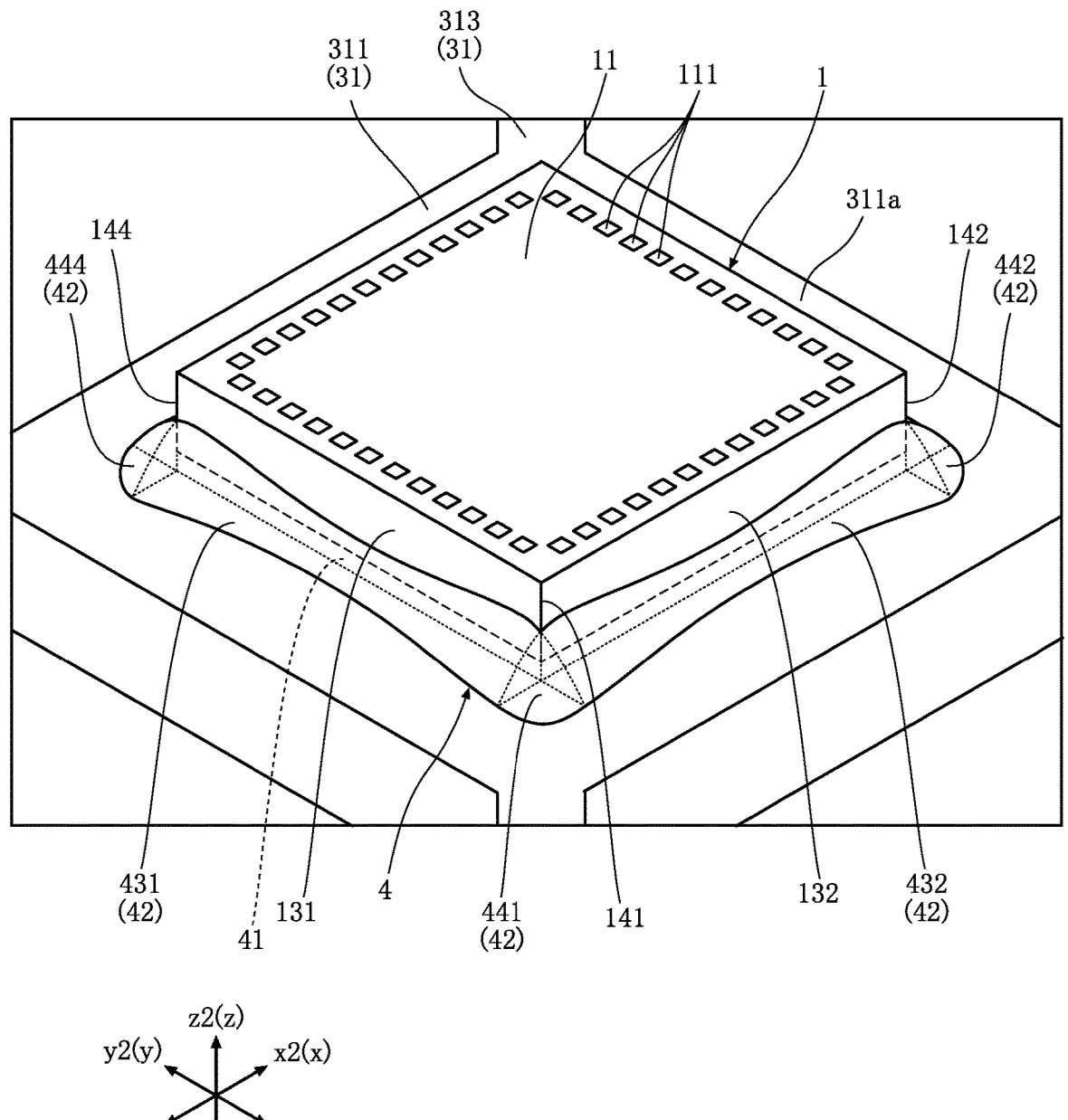
FIG. 9 is a perspective view which shows a bonding structure of the bonding material.
Figure 10:
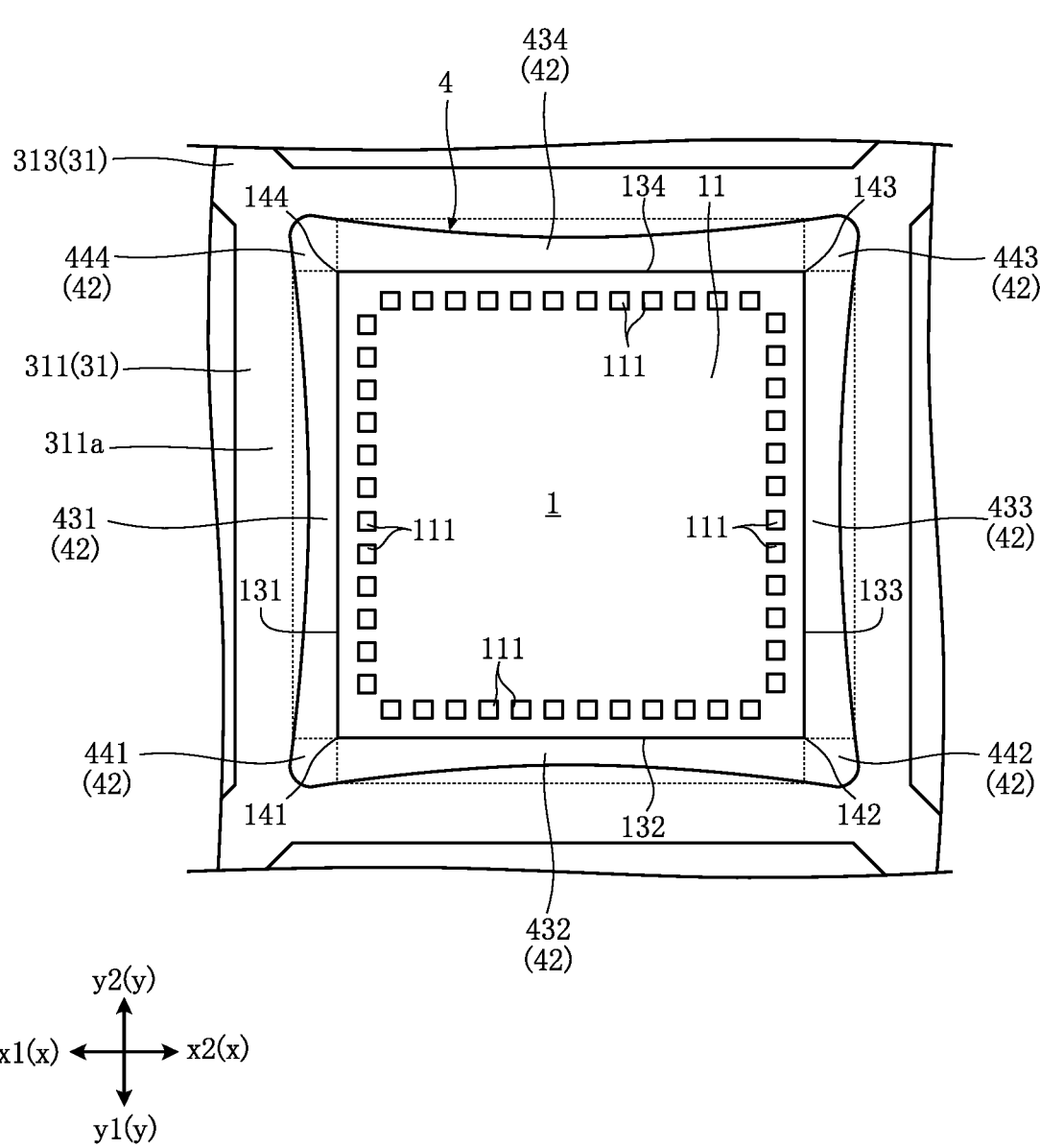
FIG. 10 is a plan view which shows a bonding structure of the bonding material.
Figure 11:
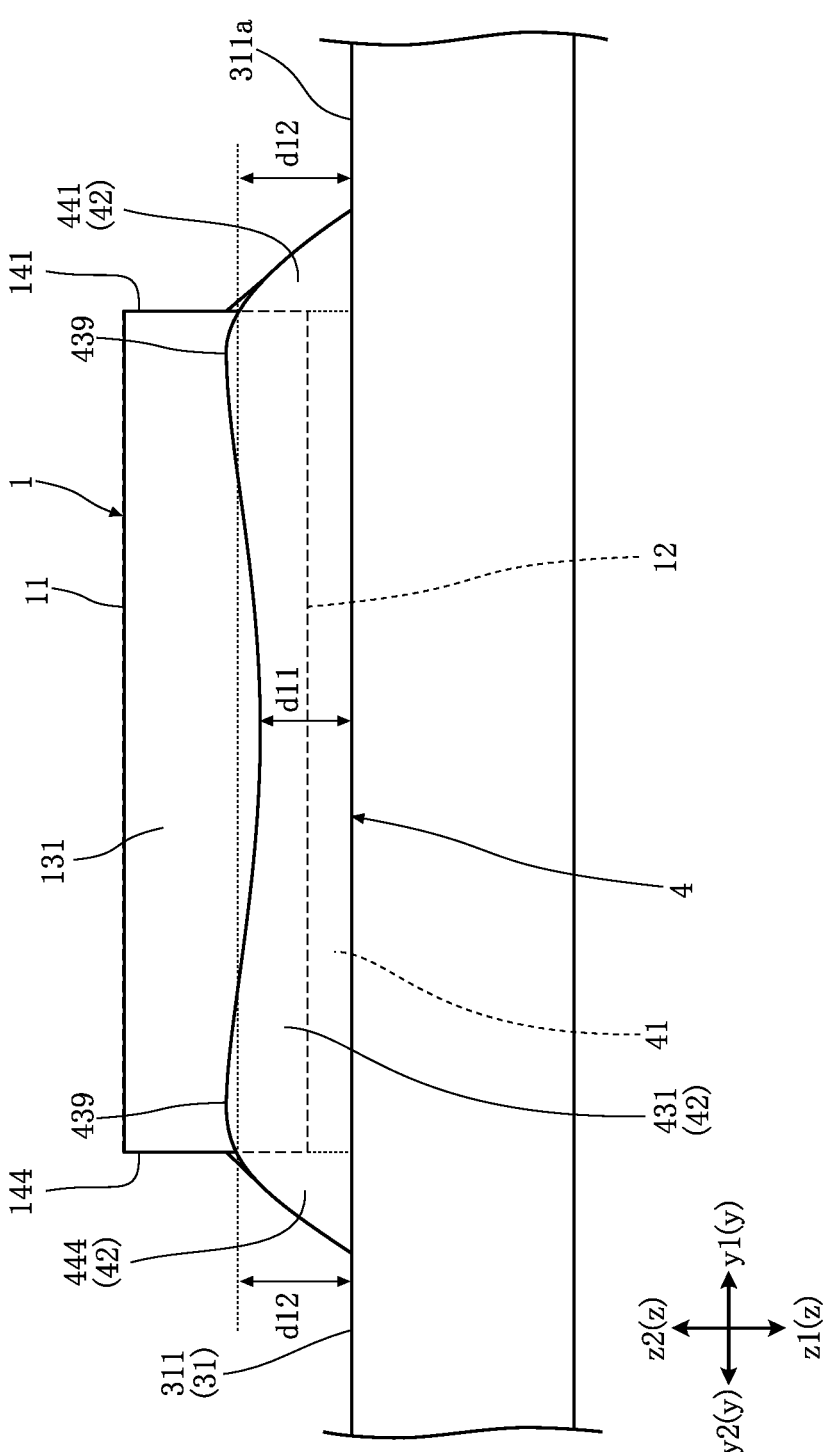
FIG. 11 is a lateral view which shows a bonding structure of the bonding material.

FIG. 1 is a plan view which shows the electric device A1. FIG. 2 is a view which shows a resin member 2 drawn by imaginary lines in FIG. 1. FIG. 3 is a bottom view which shows the electronic device A1. FIG. 4 is a front view which shows the electronic device A1. FIG. 5 is a lateral view (left side view) which shows the electronic device A1. FIG. 6 is a cross sectional view along line VI-VI of FIG. 2. FIG. 7 is a cross sectional view along line VII-VII of FIG. 2. FIG. 8 is a cross sectional view along line VIII-VIII of FIG. 2. FIG. 9 is a main part enlarged perspective view which shows a bonding structure by the bonding material 4. FIG. 10 is a main part enlarged plan view which shows a bonding structure by the bonding material 4. FIG. 11 is a main part enlarged lateral view which shows a bonding structure by the bonding material 4. For ease of understanding, the electronic component 1, a part of the lead frame 3 (the first lead 31 to be described later), and the bonding material 4 are shown in FIGS. 9-11.

For ease of explanation, three types of directions orthogonal to one another, that is, x-directions, y-directions and z-directions are defined. The z-directions are thickness directions of the electronic device A1. The x-directions are left-right directions in a plan view of the electronic device A1 (see FIG. 1). The y-directions are upward-downward directions in a plan view of the electronic device A1 (see FIG. 1). It is provided that one of the x-directions is an x1-direction and the other of the x-directions is an x2-direction. Likewise, it is provided that one of the y-directions is a y1-direction and the other of the y-directions is a y2-direction, and one of the z-directions is a z1-direction and the other of the z-directions is a z2-direction. In the following explanations, a "plan view" refers to a view seen along the z-directions. The z-directions are also referred to as the "thickness direction". Further, the x-directions are examples of the "first direction", and the y-directions are examples of the "second direction"

The electronic component 1 is an element that exhibits an electric function of the electronic device A1. The electronic component 1 is, for example, an integrated circuit element, an active function element, or a passive function element. The electronic component 1 is, for example, a semiconductor element made of a semiconductor material. As the semiconductor material, Si (silicon), SiC (silicon carbide), Ge (germanium), GaAs (gallium arsenide), GaN (gallium nitride), and so forth can be mentioned. In the present embodiment, the electronic component 1 is made of silicon. The electronic component 1 is, for example, rectangular in a plan view.

As shown in FIGS. 2 and 6-11, the electronic component 1 has an element front surface 11, and an element back surface 12, and a plurality of element lateral surfaces 131-134. The element front surface 11 and the element back surface 12 are separated from each other in the z-directions. The element front surface 11 faces the z2-direction, and the element back surface 12 faces the z1-direction. The element back surface 12 is opposed to the lead frame 3. A plurality of front surface electrodes 111 are formed on the element front surface 11. The plurality of front surface electrodes 111 are respectively exposed on the element front surface 11. A back surface electrode 121 is formed on the element back surface 12. The back surface electrode 121 is exposed on the element back surface 12. The back surface electrode 121 is formed approximately over the whole of the element back surface 12. The number, arrangement, shape, and plan view dimension of each of the front surface electrode 111 and the back surface electrode 121 are not limited to those in the examples of FIGS. 2 and 6-8, and are changed as appropriate according to the electrical component 1 that is used. The plurality of element lateral surfaces 131-134 are held between the element front surface 11 and the element back surface 12, and are continuous to both of the element front surface 11 and the element back surface 12. Each of element lateral surfaces 131-134 stand up from the element back surface 12, and they stand upright in the present embodiment. As shown in FIGS. 6, 7, 9 and so forth, the element lateral surfaces 131 and 133 are separated from each other in the x-directions. The element lateral surface 131 faces the x1-direction, and the element lateral surface 133 faces the x2-direction. The element lateral surfaces 132 and 134 are separated from each other in the y-directions. The element lateral surface 132 faces the y1-direction, and the element lateral surface 134 faces the y2-direction. The plurality of element lateral surfaces 131-134 are examples of the "first element lateral surface", the "second element lateral surface", the "third element lateral surface", and the "fourth element lateral surface", respectively.

The electronic component 1 has a plurality of ridges 141-144 as shown in FIGS. 2 and 8-11. The ridge 141 is an intersection of the element lateral surface 131 and the element lateral surface 132. The ridge 142 is an intersection of the element lateral surface 132 and the element lateral surface 133. The ridge 143 is an intersection of the element lateral surface 133 and the element lateral surface 134. The ridge 144 is an intersection of the element lateral surface 134 and the element lateral surface 131. The respective ridges 141-144 extend in the z-directions. The plurality of ridges 141-144 correspond to the four corners of the electronic component 1 in a plan view. The ridge 141 is an example of the "ridge", and the respective ridges 142-144 are examples of the "additional ridge".

The resin member 2 is a sealing material to protect the electronic component 1. The resin member 2 is made of an insulating resin material. As such a resin material, a black epoxy resin is adopted, for example. The resin member 2 covers the electronic component 1, a part of the lead frame 3, and the plurality of connection members 5. The resin member 2 is rectangular in a plan view.

The resin member 2 has a resin front surface 21, a resin back surface 22, and a plurality of resin lateral surfaces 231-234. The resin front surface 21 and the resin back surface 22 are separated in the z-directions as shown in FIGS. 4-8. The resin front surface 21 faces the z2-direction, and the resin back surface faces the z1-direction. The plurality of resin lateral surfaces 231-234 are held between the resin front surface 21 and the resin back surface 22, and are continuous to both of the resin front surface 21 and the resin back surface 22. The respective resin lateral surfaces 231-234 stand up from the resin back surface 22, and they stand upright in the present embodiment. As shown in FIGS. 1-4, the resin lateral surfaces 231 and 233 are separated from each other in the x-directions. The resin lateral surface 231 faces the x1-direction, and the resin lateral surface 233 faces the x2-direction. As shown in FIGS. 1-3 and 5, the resin lateral surfaces 232 and 234 are separated from each other in the y-directions. The resin lateral surface 232 faces the y1-direction, and the resin lateral surface 234 faces the y2-direction The lead frame 3 supports the electronic component 1, and is electrically conducted to the electronic component 1. A part of the lead frame 3 is exposed from the resin member 2, and this exposed portion is an external terminal of the electronic device A1. The lead frame 3 is made of metal, for example. As such a metal, for example, Cu (copper), Cu alloy, nickel, nickel alloy, 42Alloy, or so forth is adopted. In the present embodiment, the lead frame 3 is made of Cu. The lead frame 3 is formed, for example, by applying an etching process to a metal plate. The lead frame 3 may be formed also by applying a machining process, such as a punching process and a bending process instead of the etching process, to a metal plate. The lead frame 3 includes a first lead 31 and a plurality of second leads 32.

As shown in FIGS. 1-3, the first lead 31 is arranged at the center of the electronic device A1 in a plan view, and extend to both the x-directional ends and to both the y-directional ends of the electronic device A1. As shown in FIGS. 1-3 and 6-8, the first lead 31 includes a mounting portion 311, a plurality of terminal portions 312, and a plurality of coupling portions 313.

As shown in FIGS. 2, 6-8 and 9, the mounting portion 311 carries the electronic component 1. As shown in FIGS. 2 and 10, in a plan view, the mounting portion 311 is rectangular, for example. The respective sides of the mounting portion 311 in a plan view are substantially parallel to the x-directions or the y-directions.

As shown in FIGS. 6-8 and the like, the mounting portion 311 has a mounting surface 311*a* and a back surface 311*b*. The mounting surface 311*a* and the back surface 311*b* are separated from each other in the z-directions. The mounting surface 311 faces the z2-direction, and the back surface 311*b* faces the z1-direction. The mounting surface 311*a* is opposed to the electronic component 1 (the element back surface 12). The electronic component 1 is mounted on the mounting surface 311*a*. A plating may be applied to the mounting surface 311*a*. The material of this plating is chosen as appropriate in accordance with a material of the bonding material 4. For example, in the case where the lead frame 3 is Cu and the bonding material 4 is solder, the wettability of the solder (the bonding material 4) can be improved by applying an Ag plating or an Ni plating to the mounting surface 311*a*. As shown in FIGS. 2 and 6-8, the back surface 311*b* is exposed from the resin back surface 22, and constitutes an external terminal of the electronic device A1. As shown in FIGS. 6-8, the back surface 311*b* is flush with the resin back surface 22.

The plurality of terminal portions 312 are arranged on the four corners of the electronic device A1 respectively one by one, in a plan view as shown in FIGS. 1 and 2. Each terminal portion 312 is rectangular, for example, in a plan view.

Each terminal portion 312 has, as shown in FIGS. 3-5 and 8, a front surface 312*a*, a back surface 312*b*, and two lateral surfaces 312*c*. At each terminal portion 312, the front surface 312*a* and the back surface 312*b* are separated from each other in the z-directions. The front surface 312*a* faces the z2-direction and the back surface 312*b* faces the z1-direction. The front surface 312*a* is flush with the mounting surface 311*a* as shown in FIG. 8. The back surface 312*b* is exposed from the resin back surface 22 as shown in FIGS. 3 and 8. The two lateral surfaces 312*c* are respectively continuous to the front surface 312*a* and the back surface 312*b*, and are orthogonal to the front surface 312*a* and the back surface 312*b*. Each of the two lateral surfaces 312*c* are exposed from one of the plurality of resin lateral surfaces 231-234. One of the two lateral surfaces 312*c* faces an external x-direction, and the other of the two lateral surfaces 312*c* faces an external y-direction. The back surface 312*b* and the two lateral surfaces 312*c* are external terminals of the electronic device A1.

As shown in FIGS. 1, 2 and 8, the plurality of coupling portions 313 are respectively continuous to the mounting portion 311 and the corresponding terminal portions 312. The respective coupling portions 313 extend radially from the four corners of the mounting portion 311 in a plan view as shown in FIGS. 1-2, and are continuous to the corresponding terminal portions 312. The thickness of the coupling portion 313 (the z-directional dimension) is almost as large as one half of the thickness of the mounting portion 311, for example. The coupling portions 313 are formed by a half-etching process, for example.

Each coupling portion 313 has a front surface 313*a* and a back surface 313*b* as shown in FIG. 8. At each coupling portion 313, the front surface 313*a* and a back surface 313*b* are separated from each other in the z-directions. The front surface 313*a* faces the z2-direction, and the back surface 313*b* faces the z1-direction. As shown in FIG. 8, the front surface 313*a* is flush with the mounting surface 311*a* and the front surface 312*a*. The front surface 313*a* and the back surface 313*b* are covered by the resin member 2.

As to the first lead 31, an unillustrated plating layer is formed at a portion exposed from the resin member 2. On the electronic device A1, the plating layer is formed on the back surface 311*b*, the back surface 312*b*, and the respective lateral surfaces 312*c*. The plating layer is made of a material having a wettability for solder higher than that of the preform of the first lead 31, and is Au, for example. The plating layer is made of substitution type electroless plating, for example. Note that this plating layer does not have to be formed.

The plurality of second leads 32 are respectively conducted to the front surface electrode 111 of the electronic component 1 via the corresponding connection members 5 as shown in FIG. 2. The plurality of second leads 32 are arranged on both the x-directional ends and both the y-directional ends of the electronic device A1 and are separated from one another in a plan view as shown in FIGS. 1-3. The plurality of second leads 32 are separated from the first lead 31. The electronic device A1 includes the plurality of second leads 32 arranged along the resin lateral surface 231 in a plan view, the plurality of second leads 32 arranged along the resin lateral surface 232 in a plan view, the plurality of second leads 32 arranged along the resin lateral surface 233 in a plan view, and the plurality of second leads 32 arranged along the resin lateral surface 234 in a plan view. The plurality of second leads 32 arranged along the resin lateral surface 231 and the plurality of second leads 32 arranged along the resin lateral surface 233 are respectively arranged between two terminal portions 312 adjacent to each other in the y-direction. The plurality of second leads 32 arranged along the resin lateral surface 232 and the plurality of second leads 32 arranged along the resin lateral surface 234 are respectively arranged between two terminal portions 312 adjacent to each other in the x-direction. Each second lead 32 includes a terminal portion 321 and a connection portion 322.

Each of a plurality of terminal portions 321 is, for example, rectangular in a plan view as shown in FIG. 2. A part of each terminal portion 321 is exposed from the resin member 2.

Each terminal portion 321 has a front surface 321a, a back surface 321b, and a lateral surface 321c as shown in FIGS. 2-6. At each terminal portion 321, the front surface 321a and a back surface 321b are separated from each other in the z-directions. The front surface 321a faces the z2-direction, and the back surface 321b faces the z1-direction. The back surface 321b is exposed from the resin back surface 22. The lateral surface 321c is continuous to the front surface 321a and the back surface 321b. The lateral surface 321c is exposed from one of the plurality of resin lateral surfaces 231-234. The back surface 321b and the lateral surface 321b are external terminals of the electronic device A1.

As shown in FIG. 2, the plurality of connection portions 322 respectively extend toward the mounting portion 311 from the terminal portions 321. The corresponding connection members 5 are coupled to the respective connection portions 322. Among the plurality of second leads 32 arranged parallel to the y-directional ends of the mounting portion 311, the connection portions 322 of those closer to the x-directional ends are more inclined with respect to the y-directions. Further, among the plurality of second leads 32 arranged parallel to the x-directional ends of the mounting portion 311, the connecting portions 322 of those closer to the y-directional ends are more inclined with respect to the x-directions. Such configurations are for easy connections by the connections members 5 between the respective front surface electrodes 111 and the terminal portions 321 of the respective second leads 32. The connection portions 322 of the second leads 32 that are positioned outermost (adjacent to the coupling portions 313) in the x- and y-directions extend almost parallel to the directions in which their adjacent coupling portions 313 extend. Note that each connection portion does not have to be inclined with respect to the x- or y-direction.

As to each second lead 32, as shown in FIG. 6, the thickness (the z-directional dimension) of the connection portion 322 of each second lead 32 is approximately as half as the thickness of the terminal portion 321, for example. The connection portion 322 is formed for example by the half etching process. Each connection portion 322 has a front surface 322a and a back surface 322b. The front surface 322a and a back surface 322b are separated from each other in the z-directions. The front surface 322a faces the z2-direction, and the back surface 322b faces the z1-direction. The front surface 322a is a surface to which the connection member 5 is coupled. The front surface 321a and a front surface 322a are flush with each other. The back surface 322b is covered by the resin member 2. Note that the thickness of the connection portion 322 may be as large as the thickness of the terminal portion 321. In such a case, the back surface 321b and the back surface 322b are flush with each other, and the back surface 322b is exposed from the resin member 2 (the resin back surface 22).

As to each second lead 32, at a portion exposed from the resin member 2, an unillustrated plating layer is formed. On the electronic device A1, such a plating layer is formed on the back surface 321b and the lateral surface 321c. This plating layer is similar to the plating layer of the first lead 31. It is made of Au, for example, and is formed by the substitution type electroless plating. Note that this plating layer does not have to be formed.

The bonding material 4 bonds the electronic component 1 to the lead frame 3. The bonding material 4 is, for example, sintered silver. The bonding material 4 is not limited to sintered silver. It may be another sintered metal such as sintered copper, and may be another conductive bonding material such as solder and silver paste. Further, the bonding material 4 is not limited to a conductive bonding material, and may be an insulating bonding material as well. However, the case where the bonding material 4 is an insulating bonding material is accepted only when the electronic component 1 is not arranged on the back surface electrode 121, or when conduction between the mounting portion 311 and the back surface electrode 121 of the electronic component 1 via the bonding material 4 is not necessary. The bonding material 4 is interposed between the electronic component 1 and the mounting portion 311 (the first lead 31). The bonding material 4 is in contact with the element back surface 12 and the mounting surface 311a. The back surface electrode 121 and the mounting portion 311 are conducted to each other via the bonding material 4. The bonding material 4 includes a base portion 41 and a fillet portion 42.

As shown in FIG. 9, the base portion 41 is held between the electronic component 1 and the mounting portion 311 in the z-direction. The base portion 41 completely overlaps with the electronic component 1 in a plan view. The base portion 41 is in contact with the whole of the element back surface 12. The base portion 41 is, for example, rectangular in a plan view. The base portion 41 has an almost uniform thickness (the z-directional dimension).

The fillet portion 42 is continuous to the base portion 41 as shown in FIGS. 9 and 11, and is formed outside the electronic component 1 in a plan view. The fillet portion 42 is formed all around the electronic component 1 in a plan view as shown in FIG. 10. The fillet portion 42 sticks out from the base portion 41 in the upward z-direction along the respective element lateral surfaces 131-134 as shown in FIGS. 9 and 11. The fillet portion 42 includes a plurality of lateral cover portions 431-434 and a plurality of ridge cover portions 441-444. In the present embodiment, the ridge cover portion 441 is an example of the "ridge cover portion", and the respective ridge cover portions 442-444 are examples of the "additional ridge cover portions". Further, the lateral cover portion 431 is an example of the "first cover portion", and the lateral cover portion 432 is an example of the "second cover portion".

The ridge cover portion 441 covers at least a part of the ridge 141 as shown in FIG. 8-11. In the present embodiment, the ridge cover portion 441 covers an end of the ridge 141 on a lower z-directional side, but does not cover the other end of the ridge 141 on an upper z-directional side. The ridge cover portion 441 connects the lateral cover portion 431 and the lateral cover portion 432 as shown in FIG. 10.

The ridge cover portion 442 covers at least a part of the ridge 142 as shown in FIGS. 9 and 10. In the present embodiment, the ridge cover portion 442 covers an end of the ridge 142 on the lower z-directional side, but does not cover the other end of the ridge 142 on the upper z-directional side. The ridge cover portion 442 connects the lateral cover portion 432 and the lateral cover portion 433 as shown in FIG. 10.

The ridge cover portion 443 covers at least a part of the ridge 143 as shown in FIG. 10. In the present embodiment, the ridge cover portion 443 covers an end of the ridge 143 on the lower z-directional side, but does not cover the other end of the ridge 143 on the upper z-directional side. The ridge cover portion 443 connects the lateral cover portion 433 and the lateral cover portion 434 as shown in FIG. 10.

The ridge cover portion 444 covers at least a part of the ridge 144 as shown in FIGS. 9 and 10. In the present embodiment, the ridge cover portion 444 covers an end of the ridge 144 on the lower z-directional side, but does not cover the other end of the ridge 144 on the upper z-directional side. The ridge cover portion 444 connects the lateral cover portion 434 and the lateral cover portion 431 as shown in FIG. 10.

The lateral cover portion 431 covers at least a part of the element lateral surface 131 as shown in FIGS. 9-11. On the element lateral surface 131, a peripheral end on the z2-directional side, that is, a peripheral end on the element front surface 11 side is exposed from the lateral cover portion 431 when seen in the x-directions, and a peripheral end on the z1-directional side, that is, a peripheral end on the element back surface 12 side is covered by the lateral cover portion 431 when seen in the x-directions. The lateral cover portion 431 is held between the ridge cover portion 444 and the ridge cover portion 441 as shown in FIG. 10, and is continuous to these. The lateral cover portion 431 is aligned with the ridge cover portion 444 and the ridge cover portion 441 along the y-directions as shown in FIG. 10.

The lateral cover portion 432 covers at least a part of the element lateral surface 132 as shown in FIGS. 9 and 10. On the element lateral surface 132, a peripheral end on the z2-directional side, that is, a peripheral end on the element front surface 11 side is exposed from the lateral cover portion 432 when seen in the y-directions, and a peripheral end on the z1-directional side, that is, a peripheral end on the element back surface 12 side is covered by the lateral cover portion 432 when seen in the y-directions. The lateral cover portion 432 is held between the ridge cover portion 441 and the ridge cover portion 442, and is continuous to these as shown in FIG. 10. The lateral cover portion 432 is aligned with the ridge cover portion 441 and the ridge cover portion 442 along the x-directions as shown in FIG. 10.

The lateral cover portion 433 covers at least a part of the element lateral surface 133 as shown in FIG. 10. On the element lateral surface 133, a peripheral end on the z2-directional side, that is, a peripheral end on the element front surface 11 side is exposed from the lateral cover portion 433 when seen in the x-directions, and a peripheral end on the z1-directional side, that is, a peripheral end on the element back surface 12 side is covered by the lateral cover portion 433 when seen in the x-directions. The lateral cover portion

433 is held between the ridge cover portion 442 and the ridge cover portion 443, and is continuous to these as shown in FIG. 10. The lateral cover portion 433 is aligned with the ridge cover portion 442 and the ridge cover portion 443 along the y-directions as shown in FIG. 10.

The lateral cover portion 434 covers at least a part of the element lateral surface 134 as shown in FIG. 10. On the element lateral surface 134, a peripheral end on the z2-directional side, that is, a peripheral end on the element front surface 11 side is exposed from the lateral cover portion 434 when seen in the y-directions, and a peripheral end on the z1-directional side, that is, a peripheral end on the element back surface 12 side is covered by the lateral cover portion 434 when seen in the y-directions. The lateral cover portion 434 is held between the ridge cover portion 443 and the ridge cover portion 444, and is continuous to these as shown in FIG. 10. The lateral cover portion 434 is aligned with the ridge cover portion 443 and the ridge cover portion 444 along the x-directions as shown in FIG. 10.

As shown in FIGS. 9 and 11, the respective lateral cover portions 431-434 are recessed in the z1-direction at central portions in the respective longitudinal directions as compared to the both peripheral ends in the respective longitudinal directions. Therefore, on each of the lateral cover portions 431-434, the z-directional dimensions d11 of the respective central portions in the respective longitudinal directions are smaller than z-directional dimensions d12 of the both peripheral ends in the respective longitudinal directions. FIG. 11 shows the respective dimensions d11 and d12 of the lateral cover portion 431. Further, as to the respective lateral cover portions 431-434, elevation portions 439 are formed between the central portion in the longitudinal directions and the respective peripheral ends in the longitudinal direction. The elevation portions 439 are elevated in the z2-direction, that is, toward the element front surface 11 side. Each of the lateral cover portions 431-434 has the largest z-directional dimension at the elevation portions 439. FIG. 11 shows the elevation portions 439 of the lateral cover portion 431. The longitudinal direction of the lateral cover portions 431 and 433 is the y-directions, and the longitudinal direction of the lateral cover portions 432 and 434 is the x-directions. Note that the dimensions d11 and d12 of the lateral cover portions 431-434 may be the same with one another, and may be different from one another.

As shown in FIG. 10, as to the lateral cover portions 431-434, the central portions in the respective longitudinal directions are more recessed toward the element lateral surfaces 131-134 sides than both peripheral ends in the longitudinal direction are in a plan view.

As shown in FIGS. 6 and 7, as to the lateral cover portions 431-434, an inclination angle α11 (see FIG. 7) is larger than an inclination angle α12 (see FIG. 6). The inclination angle α11 is, as shown in FIG. 7, an angle formed by the mounting surface 311*a* and each peripheral end in the respective longitudinal direction of the lateral cover portions 431-434, and is a degree of inclination of a surface of the peripheral end with respect to the mounting portion 311*a*. The inclination angle α12 is, as shown in FIG. 6, an angle formed by the mounting surface 311*a* and the central portions in the respective longitudinal directions of the lateral cover portions 431-434, and is degree of inclination of a surface of the central portion with respect to the mounting portion 311*a*. The inclination angles of lateral cover portions 431-434 gradually change from the inclination angle α12 to the inclination angle α11 along the longitudinal directions, starting from the central portions to the peripheral ends.

Note that the inclination angle α11 may be equivalent to inclination angle α12, and also may be smaller than the inclination angle α12.

The surfaces of the lateral cover portions 431 and 433 are curved convexly when seen in the y-directions in the examples shown in FIGS. 6 and 7, but the configuration is not limited to this. The surfaces may be flat or curved concavely. Other than these, the surface may be composed of two or more of a portion curved convexly, a portion curved concavely, and a flat portion. Likewise, the surfaces of the lateral cover portions 432 and 434 are curved convexly when seen in the y-directions in the examples shown in FIGS. 6 and 7, but the configuration is not limited to this. The surfaces may be flat or curved concavely. Other than these, the surfaces may be composed of two or more of a portion curved convexly, a portion curved concavely, and a flat portion.

The plurality of connection members 5 conductively connect two locations that are separated from each other. The respective connection members 5 are bonding wires, for example. The respective connection members 5 may be bonding ribbons or plate-like lead members, rather than bonding wires. Constituent materials of the plurality of connection members 5 may be any of a metal containing Au, a metal containing Al, and a metal containing Cu, for example. Each connection member 5 is formed by a well-known wire bonder, for example. Each connection members 5 is bonded to a front surface electrode 111 of the electronic device 1 and one of the connection portions 322 (the front surfaces 322a) of each second lead 32, and conductively connects the front surface electrode 111 and the second lead 32 as shown in FIG. 2.

Figure 12:
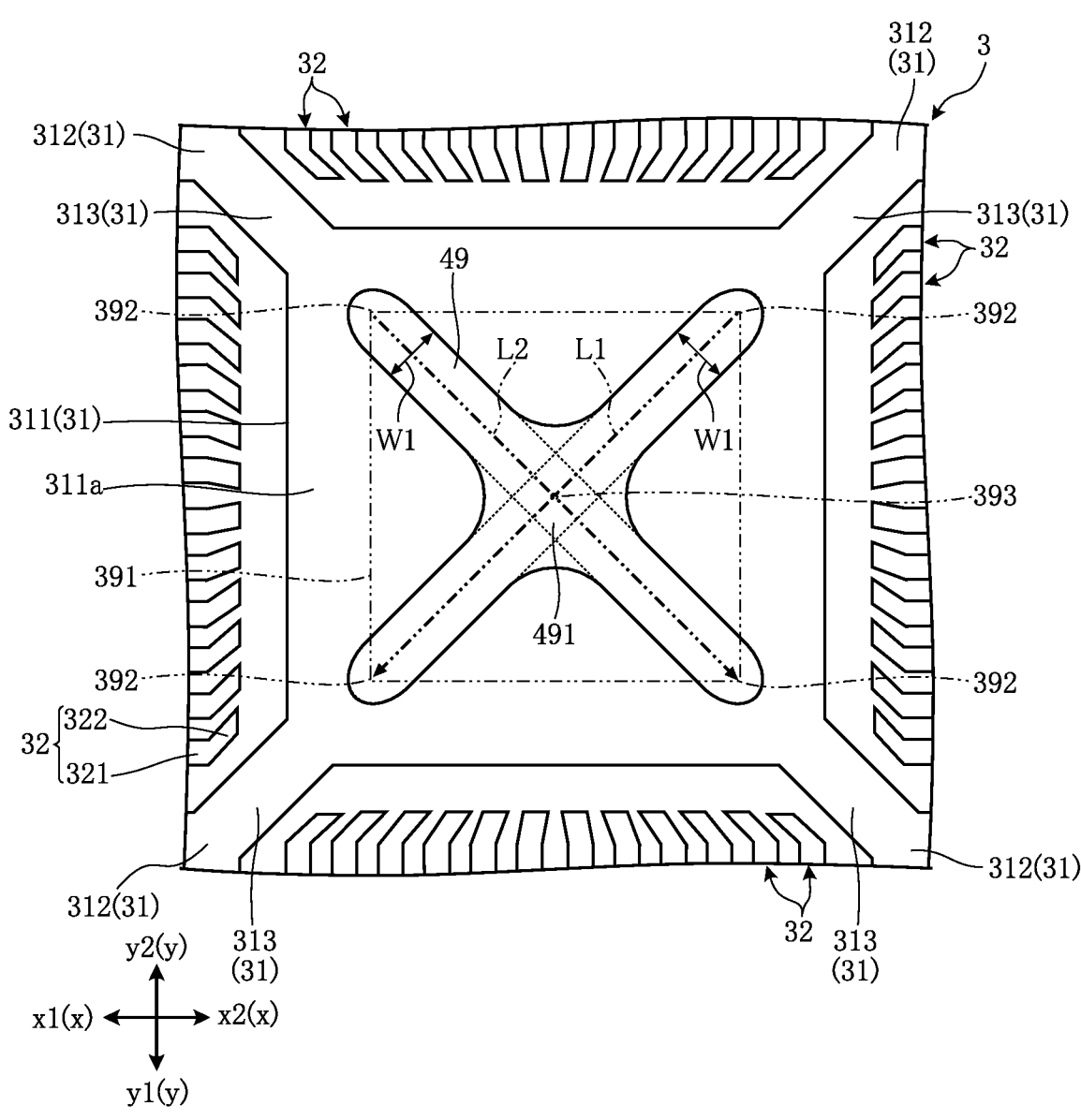
FIG. 12 is a plan view which shows one process (an application process) of the method for manufacturing the electronic device.
Figure 13:
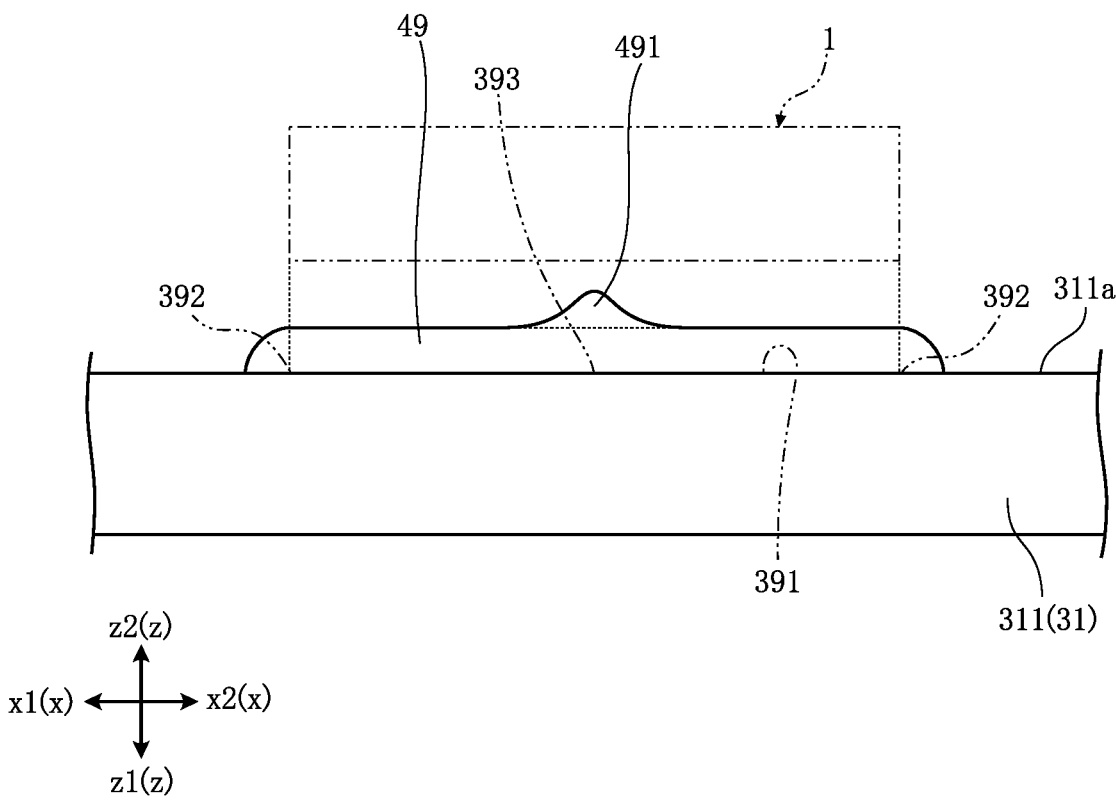
FIG. 13 is a lateral view which shows one process (an application process) of method for manufacturing the electronic device.
Figure 14:
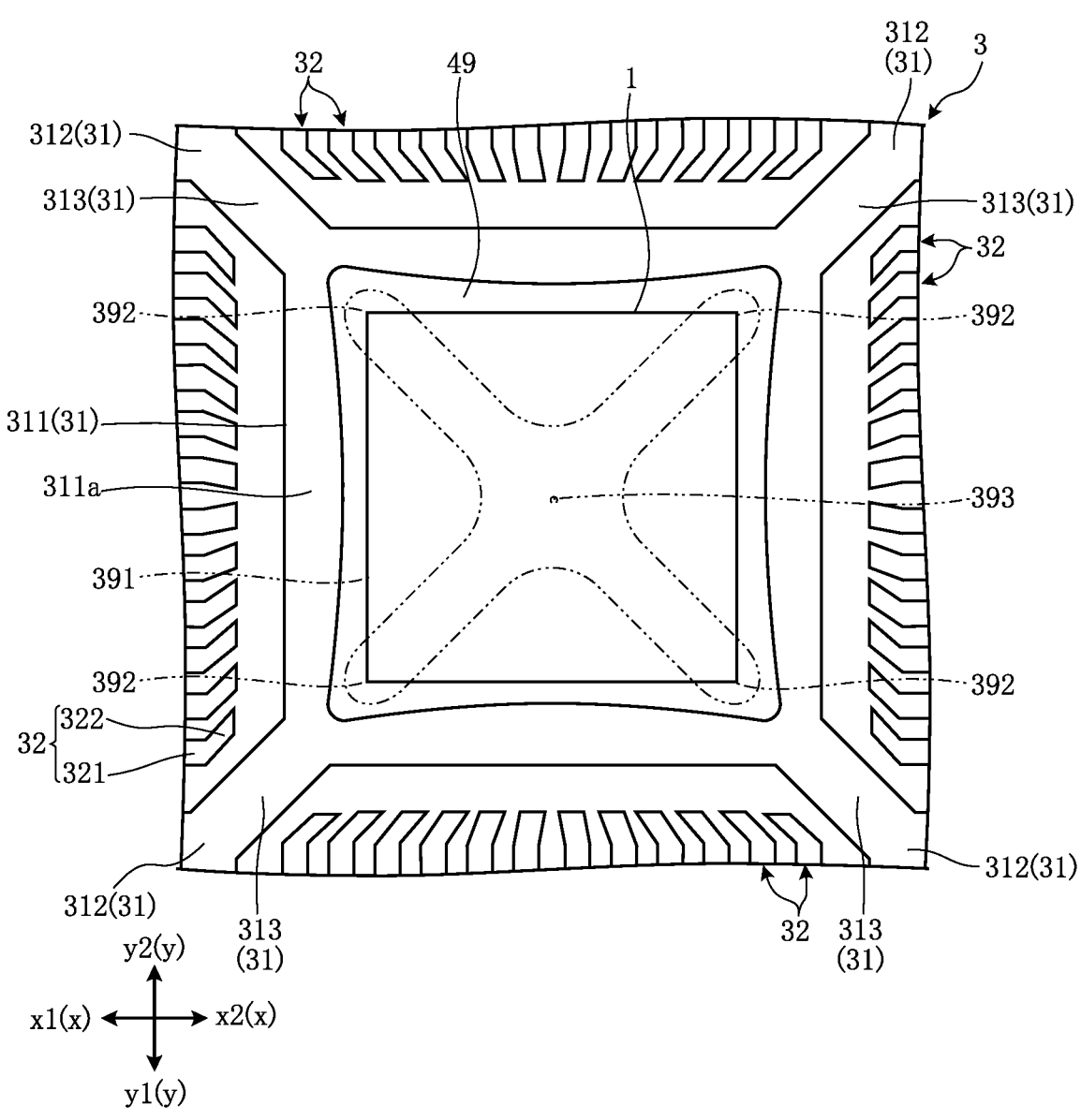
FIG. 14 is a plan view which shows one process (a placement process) of the method for manufacturing the electronic device.
Figure 15:
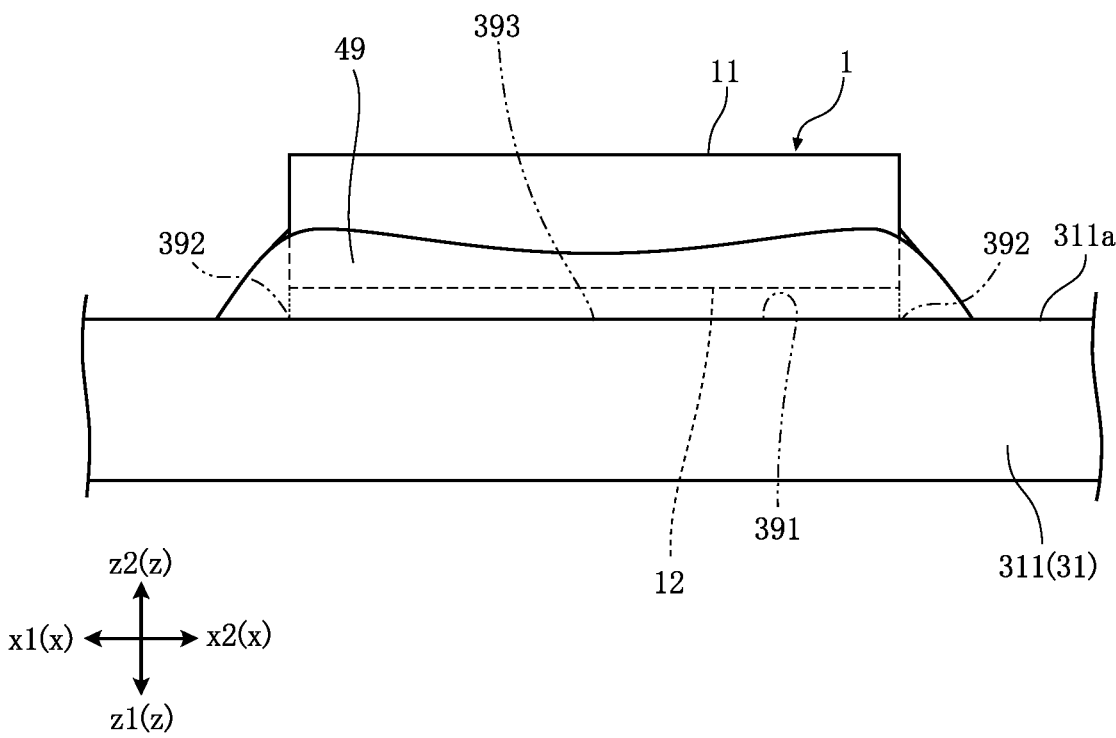
FIG. 15 is a lateral view which shows one process (a placement process) of the method for manufacturing the electronic device.

Subsequently, a method for manufacturing the electronic device A1 is explained with reference to FIGS. 12-15. FIGS. 12 and 14 are main part enlarged plan views which show a process in the method for manufacturing the electronic device A1. FIGS. 13 and 15 are main part enlarged lateral views which show a process in the method for manufacturing the electronic device A1.

First off, the lead frame 3 is prepared. Specifically, an etching process is applied to a metal plate containing copper, and a plurality of lead frames 3 are formed. Each lead frame 3 is provided with the first lead 31 and the plurality of second leads 32. The first lead 31 includes the mounting portion 311, the plurality of terminal portions 312, and the plurality of coupling portions 313. The mounting portion 311 has a mounting surface 311a facing the z2-direction. Each second lead 32 includes the terminal portion 321 and the connection portion 322. In a process for preparing the lead frame 3 (a preparation process), the plurality of formed lead frames 3 are continuous to one another.

Subsequently, as shown in FIGS. 12 and 13, a paste-like bonding material 49 is applied to the mounting surface 311a of the mounting portion 311. The paste-like bonding material 49 is paste of sintered metal (silver paste or cupper paste), for example. In the process of applying the paste-like bonding material 49 (an application process), a dispenser, for example, is used. As shown in FIGS. 12 and 13, the mounting surface 311a includes a bonding region 391 to which the electronic component 1 is bonded. The bonding region 391 is a region of the mounting surface 311a, which overlaps with the whole of the electronic component 1 in a plan view when the electronic component 1 is bonded thereto. As such, the bonding region 391 has nearly the same shape as the electronic component 1 (in the present embodiment, rectangular), and is of the same size as the electronic component 1 in a plan view. The bonding region 391 includes the four corner portions 392. The four corner portions 392 are portions that overlap with the four corners of the electronic component 1 in a plan view, when the electronic component 1 is bonded thereto. In the application process, they apply the paste-like bonding material 49 straightly along trajectories L1 and L2 shown in FIG. 12, for example. The respective trajectories L1 and L2 are application trajectories of the paste-like bonding material 49, for the dispenser. The trajectories L1 and L2 are straight lines extending from one of a pair of corner portions 392 on a diagonal line of the bonding region 391 to the other one of the pair, through the center 393. In the example shown in FIG. 12, the starting points and the ending points of the respective trajectories L1 and L2 are overlapped with the respective corner portions 392, but may be arranged outside the bonding region 391 in a plan view, rather than on the respective corner portions 392. The application trajectories of the paste-like bonding material 49 are not limited to the above. For example, the paste-like bonding material 49 may be applied starting from the center 393 of the bonding region 391 to each of the four corner portions 392 in a radiating manner in a plan view.

The applied paste-like bonding material 40, as shown in FIGS. 12 and 13, completely covers all the four corner portions 392, and are formed like a letter of X in a plan view. In the present embodiment, as to the trajectories L1 and L2 along which the paste-like bonding material 49 is applied, the starting points and the ending points are the corner portions 392, and thus the applied paste-like bonding material 49 are arranged up to the outside of the bonding region 391, farther then the corner portions 392. Further, the applied paste-like bonding material 49 has a protruding portion 491 when seen laterally (in the x-direction or the y-direction) as shown in FIG. 13. The protruding portion 491 is a part of the paste-like bonding portion 49 that sticks out in the z2-direction, and is formed on the center 393 of the bonding region 391. The protruding portion 491 is formed, as the two trajectories L1 and L2 intersect with each other when the paste-like bonding material 49 is applied along these. The applied paste-like bonding material 49 has a line-width W1 (see FIG. 12) from 200 μm to 300 μm, for example, and a thickness (the z-directional dimension) from 100 μm to 150 μm (the protruding portion 491 excluded), for example. Note that the paste-like bonding material 49 is curved like a semi-circle when seen in the advancing directions of the trajectories L1 and L2, and the above thickness is the size of the largest portion (the protruding portion 491 excluded).

Subsequently, as shown in FIGS. 14 and 15, the electronic component 1 is placed on the paste-like bonding material 49. In the process of placing the electronic component 1 (the placement process), a well-known die bonder is used, for example. When the electronic component 1 is placed on the paste-like bonding material 49 in the placement process, the paste-like bonding material 49 is expanded due to the weight of the electronic component 1. Note that the paste-like bonding material 49 may be expanded due to the pushing force applied when the electronic component 1 is pushed by the die bonder, not just by the weight of the electronic component 1. The expanded paste-like bonding material 49 covers the whole of the bonding region 391 as shown in FIGS. 14 and 15, and has a shape protruding outward all along the entire periphery of the bonding region 391. This time, the paste-like bonding material 49 has a shape almost the same as the above bonding material 4.

Subsequently, the paste-like bonding material 49 is solidified to form the bonding material 4. In the present embodiment, as the paste-like bonding member 49, sintered metal paste is used, and in the process of solidifying the paste-like bonding material 49 (solidifying process), the paste-like bonding material 49 is solidified by sintering. Due to this sintering, the solvent of the paste-like bonding material 49 vaporizes and disappears, and at the same time the metal particles (silver particles, cupper particles, or the like) in the paste-like bonding material 49 are combined together. Thus the paste-like bonding material 49 is solidified to form the bonding material 4. The solidifying process is altered as appropriate according to a kind of the paste-like bonding material. For example, in the case where the paste-like material 49 is thermosetting metal paste, the paste-like bonding material 49 is heated in the solidifying process. This heating cures the resin material in the metal paste, and thus the paste-like bonding material 49 solidifies to form the bonding member 4. In the present disclosure, the "metal paste" is a conductive material composed of metallic microparticles, microparticles of epoxy resin (binder) and solvent, for example.

Subsequently, the plurality of connection members 5 are formed. Each of the plurality of connection members 5 is formed by a well-known wire bonder, for example. One end of each connection member 5 is bonded to the front surface electrode 111 of the electronic component 1, and the other end is bonded to the connection portion 322 (the front surface 322a) of a second lead 32.

Subsequently, the resin member 2 is formed. In the process to form the resin member 2 (the resin formation process), a well-known transfer molding machine or a compression molding machine, for example. As the resin member 2, an insulating epoxy resin is used, for example. The lead frame 3 is partially exposed from the molded resin member 2.

Thereafter, the resin material 2 and the lead frame 3 are cut and individualized for each electronic device 1. Through the above processes, the electronic device A1 is formed. Note that the above method for manufacturing is merely an example, and is not limitative.

The operation and the effect of the electronic device A1 and the method for manufacturing the electronic device are as follows.

On the electronic device A1, the bonding material 4 that bonds the electronic component 1 to the lead frame 3 includes the fillet portion 42. The fillet portion 42 includes the ridge cover portion 441 that at least partially covers the ridge 141. The ridge 141 is an intersection of the element lateral surface 131 and the element lateral surface 132, and corresponds to one of the four corners of the electronic component 1 in a plan view. According to this configuration, the ridge 141 of the electronic component 1 (the lower-directional part of the electronic component 1) is protected by the bonding material 4 (the ridge cover portion 441 of the fillet portion 42). Due to heat generated when applying voltage to the electronic component 1, thermal stress origi-nated from the difference of linear expansion coefficients of the electronic component 1 and the lead frame 3 is applied to the bonding material 4. This thermal stress applied to the bonding material 4 is strongest at around the lower sides of the four corners of the electronic component 1. As such, peeling off and damaging of the bonding material 4 are likely to start from around the ridge 141 of the electronic component 1. In particular, on the conventional electronic device, the ridge 141 was exposed from the bonding material 4, and the peeling off and damaging of the bonding material 4 was conspicuous around the lower end of the four corners of the electronic component 1. Then, as to the electronic device A1, the resistance with respect to the peeling off and damaging of the bonding material 4 at around the ridge 141 can be improved by protecting the ridge 141 by the ridge cover portion 441. Thus, according to the electronic device A1, the peeling and damaging of the bonding material 4 can be prevented. As such, the reliability of the electronic device A1 can be improved.

On the electronic device A1, the fillet portion 42 of the bonding material 4 includes the plurality of ridge cover portions 441-444. The plurality of ridge cover portion 441-444 respectively cover the plurality of ridges 141-144 of the electronic component 1 at the peripheral ends on the lower sides. In other words, the lower sides of the four corners of the electronic component 1 are covered by the fillet portion 42. According to this configuration, the resistance with respect to the peeling off and damaging of the bonding material 4 around the lower sides of the four corners of the electronic component 1 can be improved. Therefore, according to the electronic device A1, the peeling off and damaging of the bonding material 4 can be suppressed.

On the electronic device A1, the bonding material 4 includes the base portion 41. The base portion 41 is held between the electronic component 1 and the mounting portion 311, and is completely overlapped with the elec-tronic component 1. The base portion 41 is in contact with the whole of the element back surface 12. On the conven-tional electronic device, there was a space between the electronic device 1 and the mounting portion 311 which was not filled with the bonding material 4. That is, there was a region on the element back surface 12 of the electronic component 1 that is not in contact with the bonding material 4. In the case where there is a tiny scratch on this region of the electronic component 1 (such as chipping on the periph-eral edge of the element back surface 12), sometimes destruction (such as cracking) advances inside the electronic component 1, starting from this scratch. Whereas, on the electronic device A1, the whole of the element back surface 12 is in contact with the bonding material 4 (the base portion 41), and thus the element back surface 12 is protected by the bonding material 4 (the base portion 41). Therefore, accord-ing to the electronic device A1, even when there is a tiny scratch on the element back surface 12 of the electronic component 1, the advancement of the destruction of the electronic component 1 starting from this scratch can be suppressed.

On the electronic device A1, the bonding material 4 is made of sintered silver, for example. Sintered silver has a ductility lower than that of solder. Therefore, when the bonding material 4 is made of sintered silver, the thermal stress applied to the bonding material 4 becomes larger than in the case when the bonding material 4 is made of solder. This is because the solder can mitigate the thermal stress due to its ductility more than the sintered silver does. In other words, when the bonding material 4 is made of sintered silver, peeling off or damaging of the bonding material 4 caused by the thermal stress is more likely to occur than in the case where the bonding material 4 is made of solder. As such, in the case where the bonding material 4 is made of sintered silver, it is effective in suppressing peeling off or damaging of the bonding material 4 as compared to the case where the bonding material 4 is made of solder, to protect the ridge 141 by the fillet portion 42 (the ridge cover portion 441) as above.

On the electronic device A1, the electronic component 1 is a semiconductor element made of silicon, for example, and the lead frame 3 is made of Cu, for example. In this case, there is a large discrepancy in the line expansion coefficients of silicon and Cu, and therefore the thermal stress applied to the bonding material 4 becomes large. That is, the peeling off or damaging of the bonding material 4 due to the thermal stress is more likely to occur. Therefore, in the case where the electronic component 1 made of silicon is bonded to the mounting portion 311 (the lead frame 3) made of cupper using the bonding material 4, it is effective in suppressing the peeling off or damaging of the bonding material 4, to protect the ridge 141 by the fillet portion 42 (the ridge cover portion 441) as above.

In the method for manufacturing the electronic device A1, the four corners of the bonding region 391 is covered by the paste-like bonding material 49, by applying the paste-like bonding material 49 up to the respective corner portions 392 of the bonding region 391 in the application process. According to this, the paste-like bonding material 49 spreads so as to cover at least a part of each of the ridges 141-144 of the electronic component when arranging the electronic component 1 on the paste-like bonding material 49 in the placement process. That is, the fillet portion 42 including the ridge cover portion 441 is formed on the bonding material 4. Thus, according to the method for manufacturing according to the present disclosure, the electronic device A1 can be manufactured on which the peeling off and damaging of the bonding material 4 is suppressed.

As to the method for manufacturing the electronic device A1, in the application process, the paste-like bonding material 49 is applied so that it has an X-shaped form in a plan view. Regarding the application process different from that of the present embodiment, it is conceivable that the fillet portion 42 including the respective ridge cover portions is formed by applying the paste-like bonding material 49 all over the bonding region 391 or larger. However, in this case, the paste-like bonding material 49 can spread largely beyond the electronic component 1 in a plan view, when the electronic component 1 is arranged in the placement process. There is a fear that in this case, the paste-like bonding material 49 flows into an unexpected place, which results in an unexpected short-circuiting, for example. The unexpected short-circuiting includes a short-circuiting between the front surface electrodes 111 of the electronic component 1. Further, there is also a fear of a cost increase due to cost of material of the uselessly expanded portion. As such, according to the method for manufacturing the present disclosure, while forming the fillet portion 42 including the respective cover portions 441-444, an occurrence of the unexpected short-circuiting and the cost increase as above can be prevented, by applying the paste-like material 49 so that it has the X-shaped form.

Figure 16:
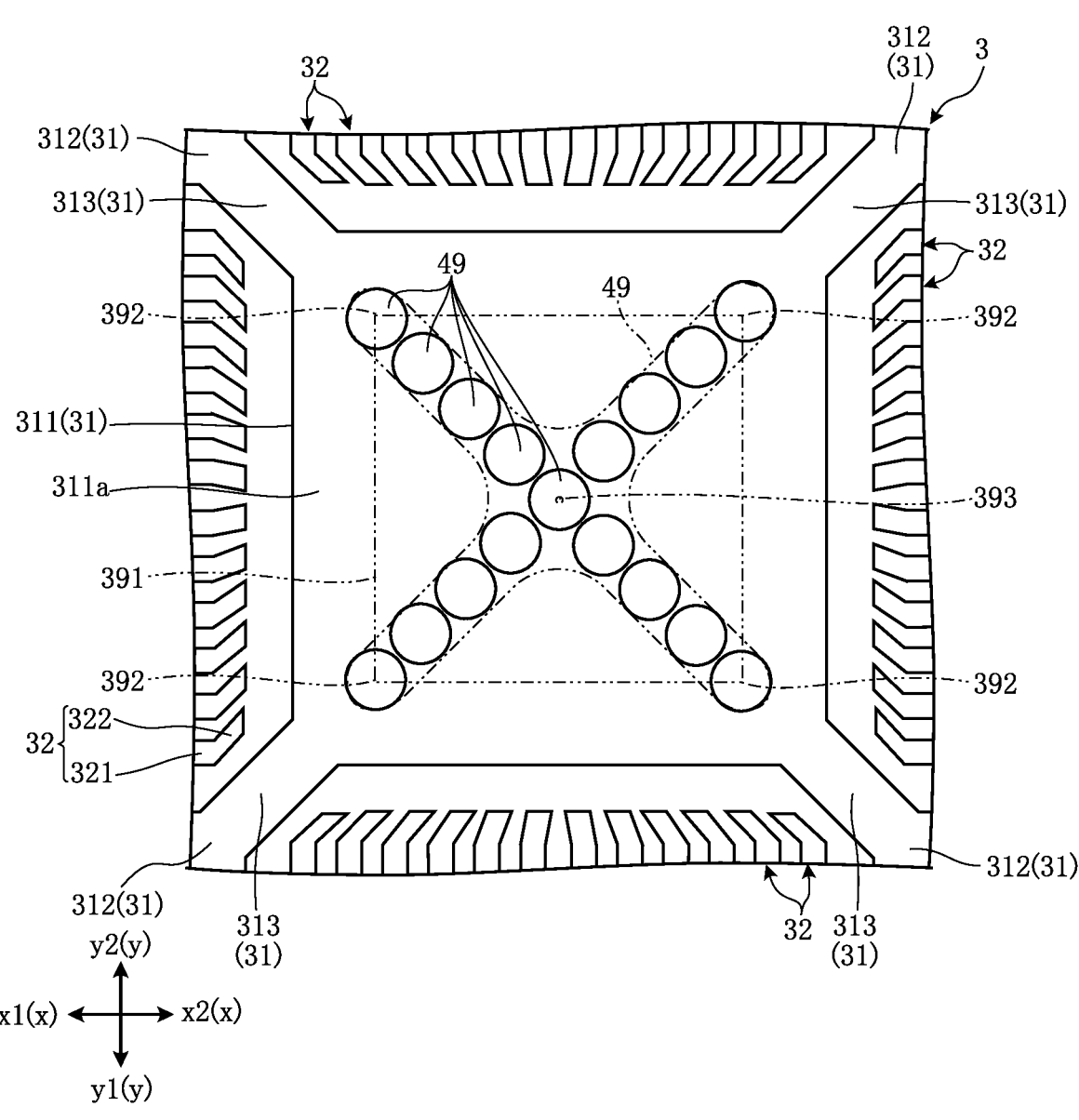
FIG. 16 is a plan view which shows the application process of a variation.

Regarding the application process of the above embodiment, an example is shown where the paste-like bonding material 49 is applied linearly along the trajectories L1 and L2, but this is not limitative. For example, as shown in FIG. 16, dots of the paste-like bonding material may be applied in the X-shaped form. For ease of understanding, in FIG. 16, the paste-like bonding material 49 (see FIG. 12) of the above embodiment is drawn by an imaginary line. Each paste-like bonding material 49 is, for example, hemispherical. Also in this case, the bonding material 4 is formed similar to those in FIGS. 9-11. As other application patterns for the paste-like bonding material 49, firstly, patterns such as the "*"-shape form and the "X"-shape form used for the electronic component 1 having a large rectangular planar shape (typically, a large square) can be mentioned. The "X"-shape form is a form composed of four line segments arranged in an "X"-shaped form, and four "dots" arranged between two neighboring line segments that are adjacent to each other in the x-direction or in the y-direction. Secondly, as a pattern adopted for an electronic component 1 having an horizontally elongated rectangular shape, there is a pattern where ">", "-", and "<" are arranged in this order, and are in contact or adjacent to each other along the longitudinal direction.

Figure 17:
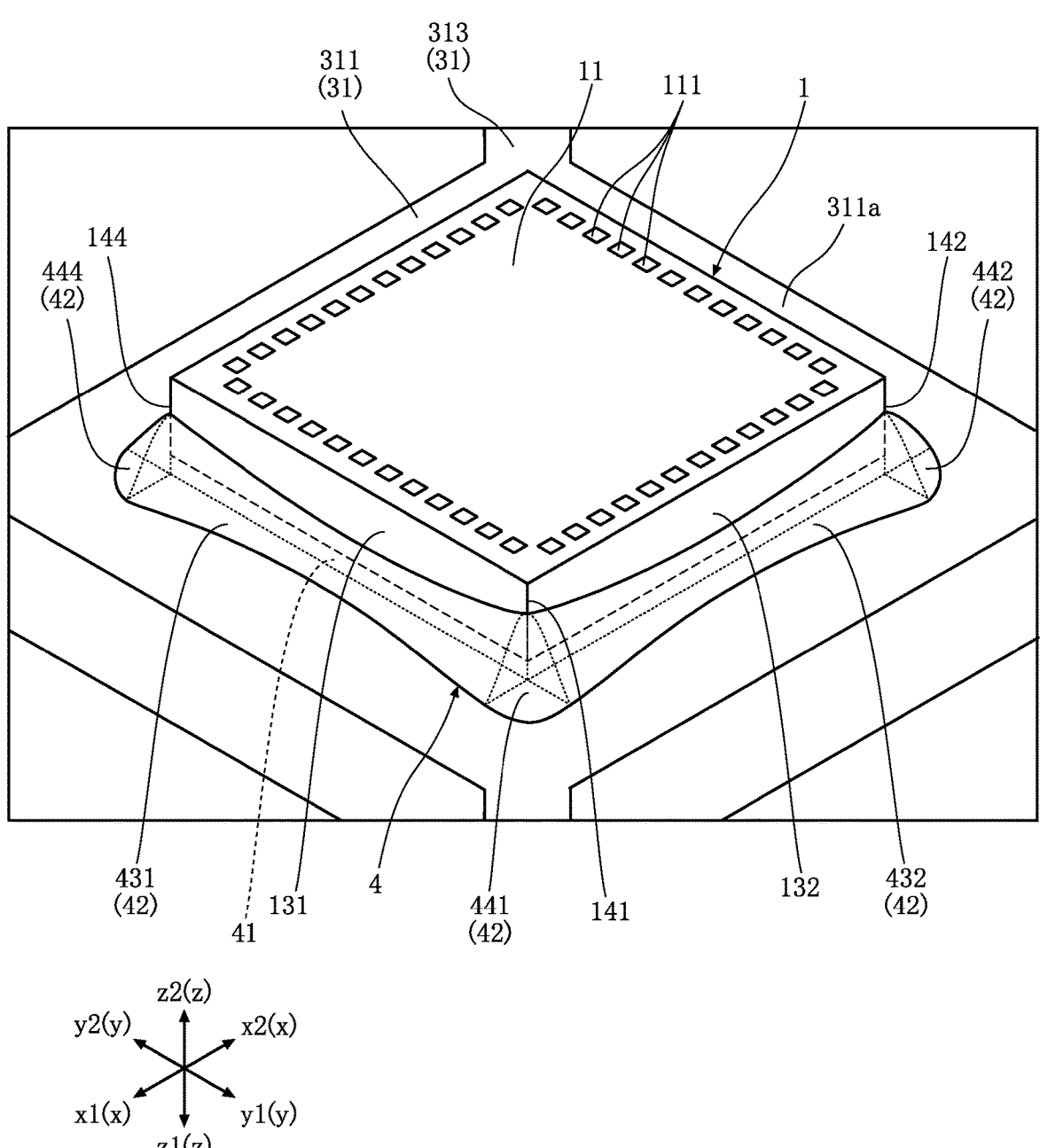
FIG. 17 is a perspective view which shows a lateral covered portion (a fillet portion) of a variation.
Figure 18:
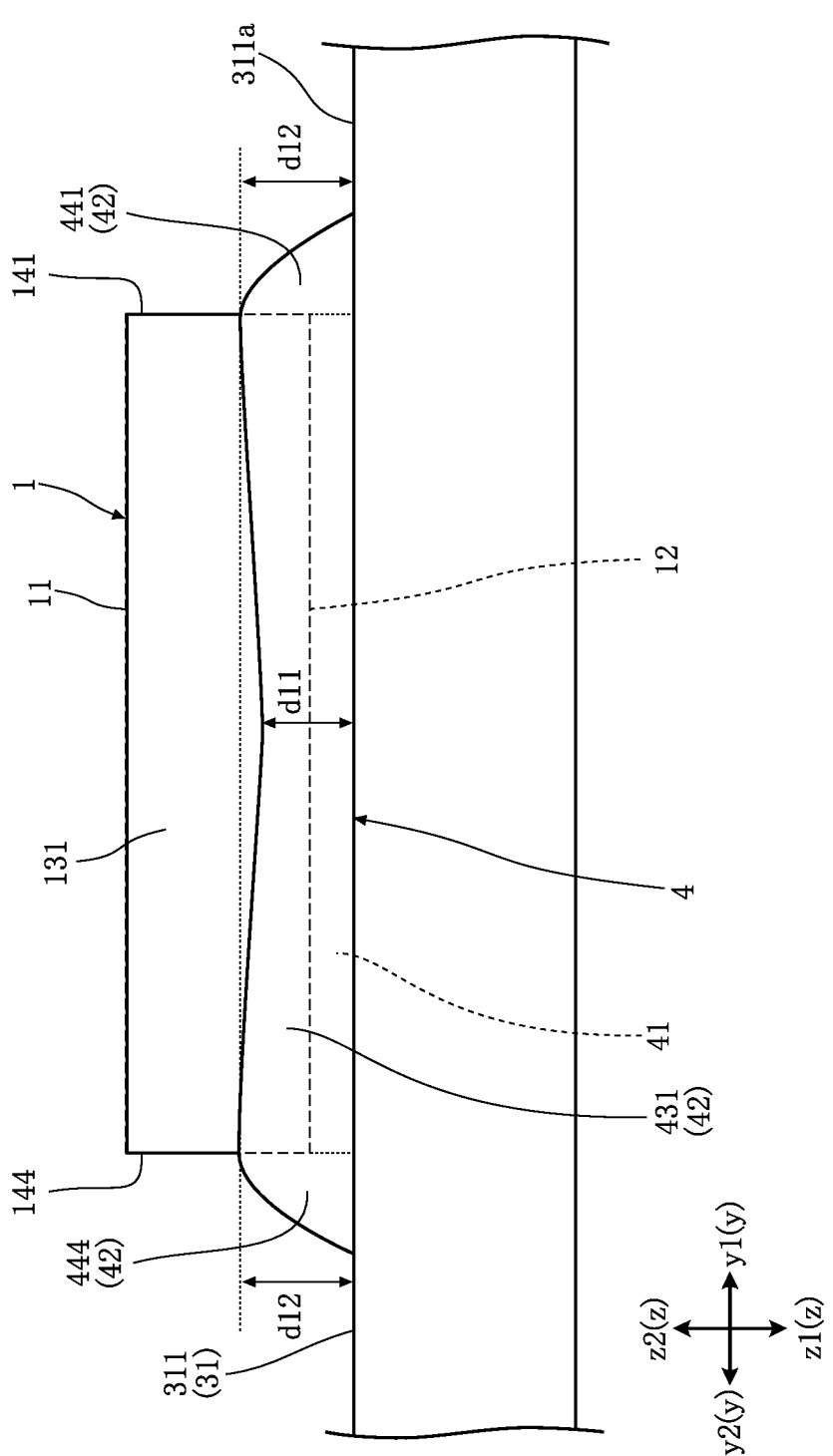
FIG. 18 is a lateral view which shows a lateral covered portion (a fillet portion) of FIG. 17.
Figure 19:
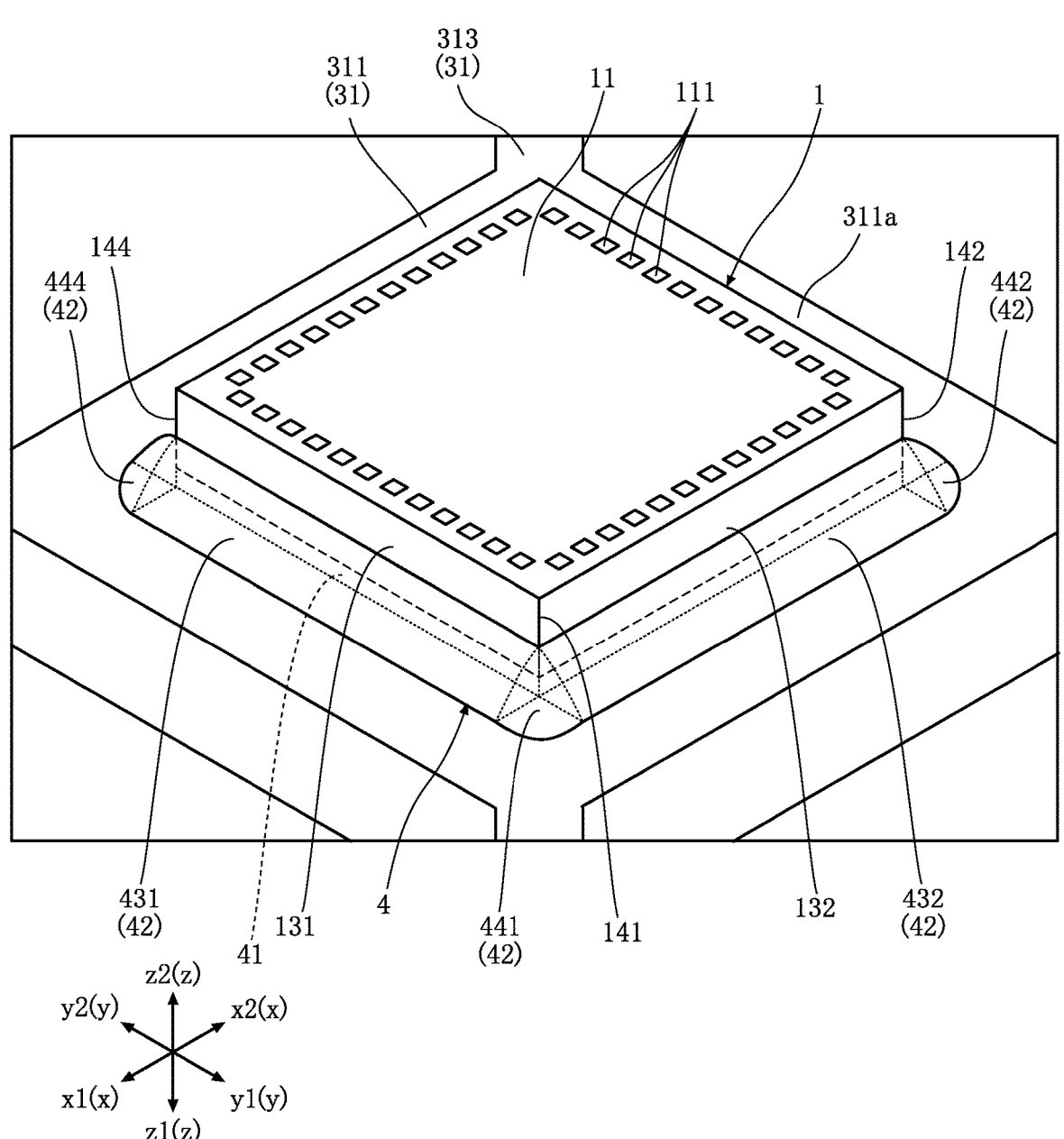
FIG. 19 is a perspective view which shows a lateral covered portion (a fillet portion) of a variation.
Figure 20:
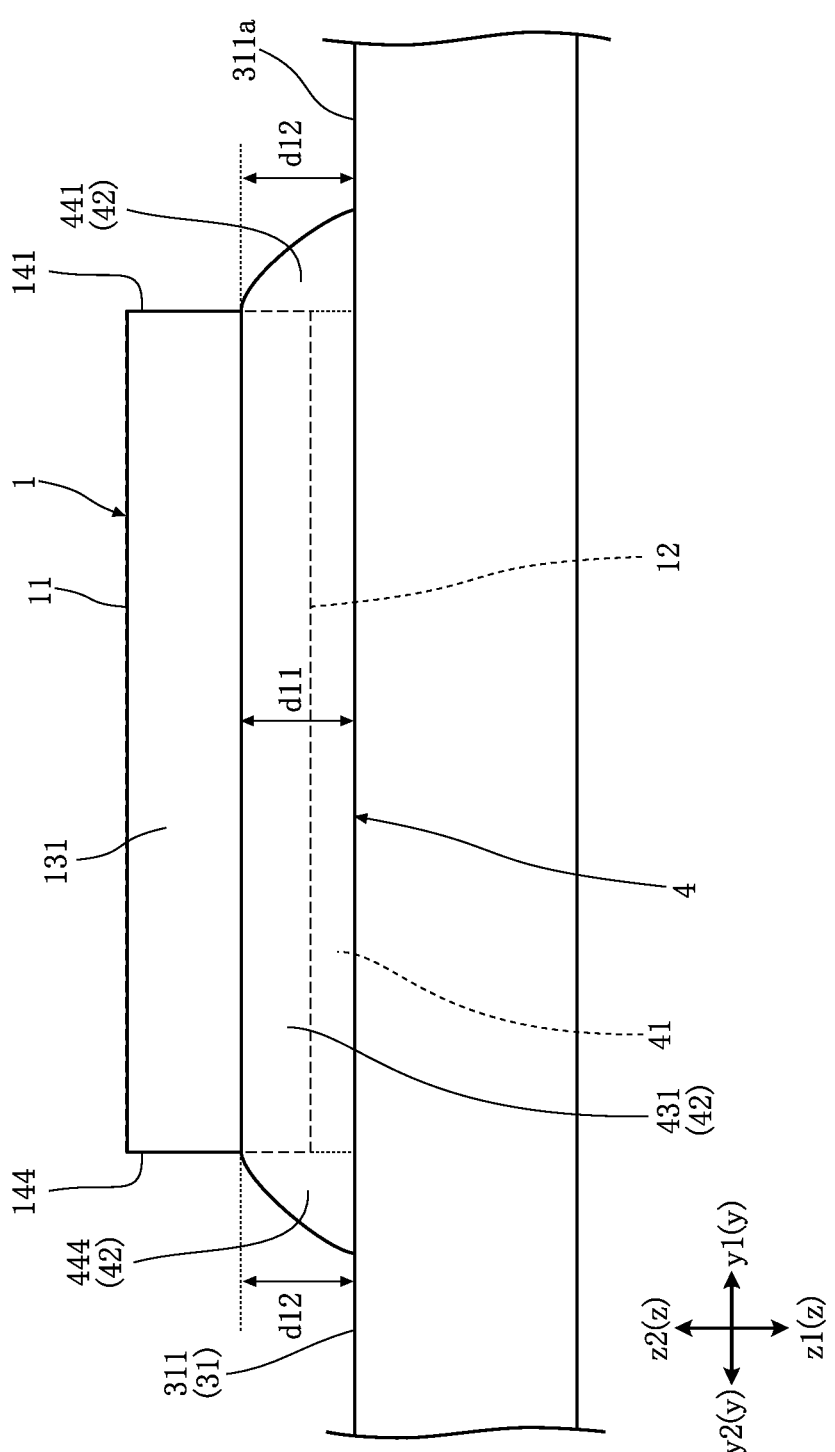
FIG. 20 is a lateral view which shows a lateral covered portion (a fillet portion) of FIG. 19.
Figure 21:
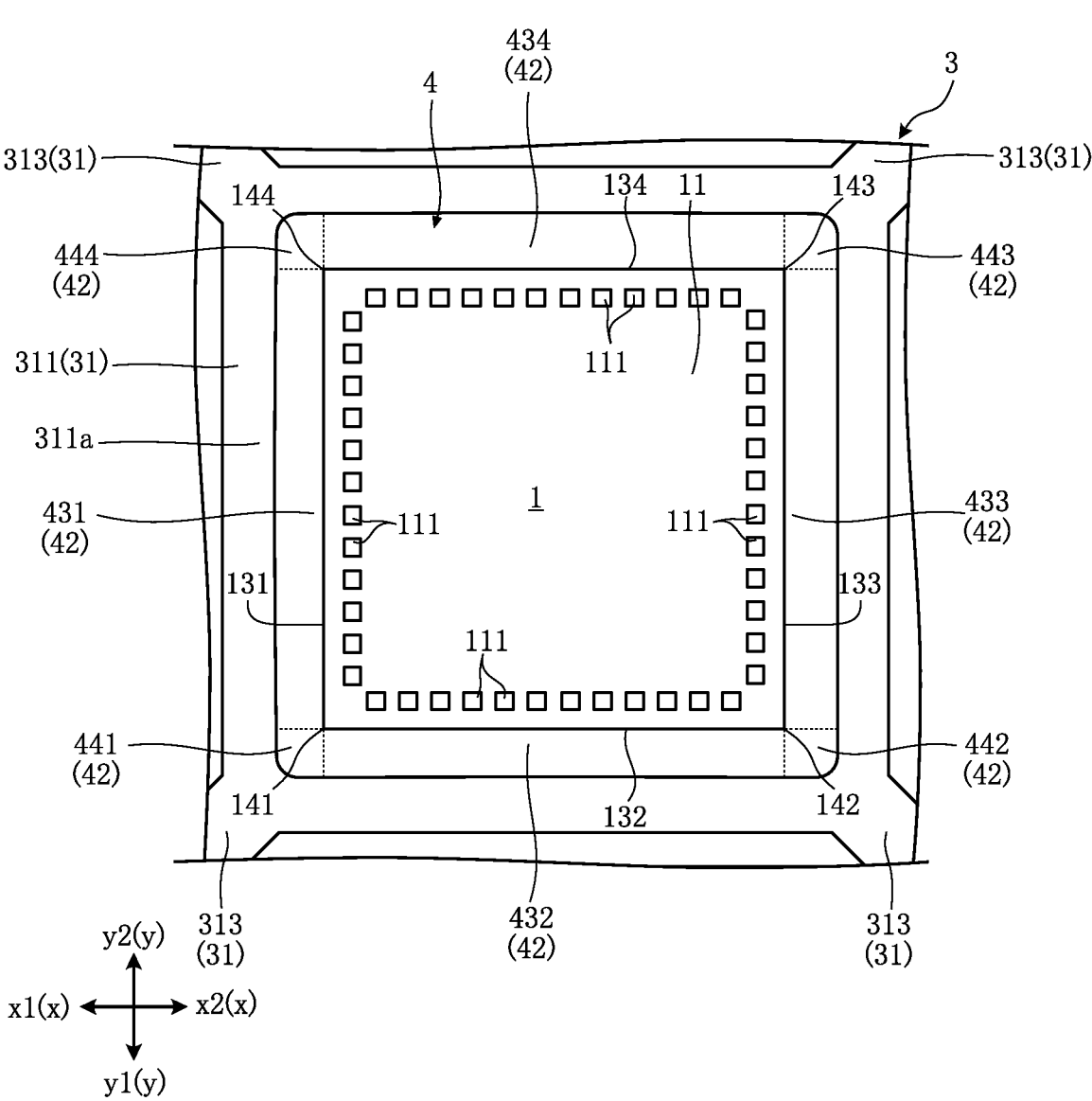
FIG. 21 is a plan view which shows a lateral covered portion (a fillet portion) of a variation.

As to the electronic device A1, shapes of the respective lateral cover portions 431-434 are not limited to the above described ones. For example, as shown in FIGS. 17 and 18, the elevation portion 439 (see FIG. 11) does not have to be formed on the lateral cover portions 431-434. Further, as shown in FIGS. 19 and 20, the respective cover portions 431-434 may be configured that their central portions in the longitudinal directions are not recessed in the z1-direction as compared to the both ends in the longitudinal directions, and the dimension d11 and d12 are approximately the same with each other. Further, as shown in FIG. 21, the respective cover portions 431-434 may be configured that their central portions in the longitudinal directions are not recessed as compared to the both ends in the longitudinal directions towards the respective element lateral surfaces 131-134. Or, in a plan view, the central portions in the respective longitudinal directions may protrude so as to separate from the respective element lateral surfaces 131-134 as compared to the both peripheral ends in the longitudinal direction. The respective lateral cover portions 431-434 according to those variations are formed, adjusting the application amount, the application trajectories, and the line width W1 during the application process, the spreading pattern of the paste-like bonding material 49 during the placement process, and the wettability of the paste-like bonding material 49 with respect to the mounting portion 311 (the lead frame 3), as appropriate.

As to the above embodiments, the cases are shown where the electronic device A1 has the package structure of the QFN type, but this is not limitative. For example, other package structures may be adopted, such as the TO (Transistor Outline) package type, the SOP (Small Outline Package) type, QFP (Quad Flat Package) type, and the BGA (Ball Grid Array) type. The shape of the lead frame 3 is changed as appropriate, according to those package structure.

As to the above embodiments, the cases are shown where the electronic device A1 is of the lead frame type, but this is not limitative. For example, it may be of the interposer type. That is, it may be configured that the electronic component 1 is bonded to a silicon substrate, a ceramic substrate, a glass substrate, and the like, rather than to the lead frame 3. Also, the configuration of the present disclosure may be adopted for the structure to bond the electronic component 1 to a supporting member (a mounting portion) via the bonding material 4.

The electronic device and the method for manufacturing the electronic device according to the present disclosure are not limited to the above embodiments. The specific configurations of each portions of the electronic device of the present disclosure and the specific processing of each process of the method for manufacturing the electronic device of the present disclosure can be freely redesigned. For example, the electronic device and the method for manufacturing the electronic device according to the present disclosure includes embodiments relating to the following clauses.

Clause 1.

An electronic device, comprising:

an electronic component having an element front surface and an element back surface separated from each other in a thickness direction;

a mounting portion which has a mounting surface opposed to the element back surface and on which the electronic component is mounted; and a bonding material to bond the electronic component to the mounting portion, wherein the bonding material includes a base portion held between the electronic component and the mounting portion in the thickness direction, and a fillet portion connected to the base portion and formed outside the electronic component when seen in the thickness direction, wherein the electronic component includes a first element lateral surface and a second element lateral surface each of which is continuous to the element front surface and the element back surface, and a ridge which is an intersection of the first element lateral surface and the second element lateral surface and extends in the thickness direction, and wherein the fillet portion includes a ridge cover portion which at least covers a part of the ridge.

Clause 2.

The electronic device according to clause 1, wherein the fillet portion further includes a first cover portion to cover at least a part of the first element lateral surface, and a second cover portion to cover at least a part of the second element lateral surface, and wherein the first cover portion and the second cover portion are respectively continuous to the ridge cover portion.

Clause 3.

The electronic device according to clause 2, wherein on the first element lateral surface, a peripheral end continuous to the element front surface is exposed from the first cover portion when seen in a first direction orthogonal to the first element lateral surface, and wherein on the second element lateral surface, a peripheral end continuous to the element front surface is exposed from the second cover portion when seen in a second direction orthogonal to the second element lateral surface Clause 4.

The electronic device according to clause 3, wherein the electronic component is rectangular when seen in the thickness direction, and wherein the thickness direction, the first direction, and the second direction are orthogonal to one another.

Clause 5.

The electronic device according to clause 4, wherein the electronic component further comprises a third element lateral surface, a fourth element lateral surface, and a plurality of additional ridges, wherein the third element lateral surface is continuous to the element front surface and the element back surface and is separated from the first element lateral surface in the first direction, wherein the fourth element lateral surface is continuous to the element front surface and the element back surface and is separated from the second element lateral surface in the second direction, wherein the plurality of additional ridges exist at an intersection of the first element lateral surface and the fourth element lateral surface, an intersection of the second element lateral surface and the third element lateral surface, and an intersection of the third element lateral surface and the fourth element lateral surface, respectively, and each of them extend in the thickness direction, and wherein the fillet portion further includes a plurality of additional ridge cover portions to cover the plurality of additional ridges.

Clause 6.

The electronic device according to clause 4 or clause 5, wherein as to the first cover portion, a dimension in the thickness direction of a central portion in the second direction is smaller than a dimension in the thickness direction of a peripheral end continuous to the ridge cover portion.

Clause 7.

The electronic device according to one of clauses 4 to 6, wherein the first cover portion has an elevation portion elevated toward an element front surface side between a central portion in the second direction and a peripheral end continuous to the ridge cover portion.

Clause 8.

The electronic device according to one of clauses 4 to 7, wherein as to the first cover portion a central portion in the second direction is recessed toward a first element lateral surface side when seen in the thickness direction.

Clause 9.

The electronic device according to one of clauses 4 to 8, wherein as to the first cover portion, a degree of inclination with respect to the mounting surface of a peripheral end continuous to the ridge cover portion is larger than a degree of inclination with respect to the mounting surface of a central portion in the second direction.

Clause 10.

The electric device according to one of clauses 4 to 9, wherein as to the second cover portion, a dimension in the thickness direction of a central portion in the first direction is smaller than a dimension in the thickness direction of a peripheral end continuous to the ridge cover portion.

Clause 11.

The electronic device according to one of clauses 4 to 10, wherein the second cover portion has an elevation portion elevated toward an element front surface side between a central portion in the first direction and a peripheral end continuous to the ridge cover portion.

Clause 12.

The electronic device according to one of clauses 4 to 11, wherein as to the second cover portion a central portion in the first direction is recessed toward a second element lateral surface side when seen in the thickness direction.

Clause 13.

The electronic device according to one of clauses 4 to 12, wherein as to the second cover portion, a degree of inclination with respect to the mounting surface of a peripheral end continuous to the ridge cover portion is larger than a degree of inclination with respect to the mounting surface of a central portion in the first direction.

Clause 14.

The electronic device according to one of clauses 1 to 13, wherein the fillet portion is formed all around the electronic component when seen in the thickness direction.

Clause 15. The electronic device according to one of clauses 1 to 14, wherein the electronic component is made of a semiconductor material.

Clause 16.

The electronic device according to one of clauses 1 to 15, wherein as to the electronic component, a front surface electrode is formed on the element front surface, wherein the mounting portion is a part of the lead frame, and wherein the lead frame is conducted to the front surface electrode, and further includes a terminal portion that is separated from the mounting portion.

Clause 17.

The electronic device according to clause 16, wherein a constituting material of the lead frame is a metal containing Cu.

Clause 18.

The electronic device according to clauses 1 to 17, wherein as to the electronic component, a back surface electrode is formed on the element back surface, and wherein the back surface electrode is conducted to the mounting portion via the bonding material.

Clause 19.

The electronic device according to clauses 1 to 18, wherein the bonding material is made of sintered silver.

Clause 20.

A method for manufacturing an electronic device comprising an electronic component having an element front surface and an element back surface separated from each other in a thickness direction, a mounting portion which has a mounting surface opposed to the element back surface and on which the electronic component is mounted, and a bonding material to bond the electronic component to the mounting portion, the method comprising:

an application process of applying a paste-like bonding material to the mounting surface;

a placement process of arranging the electronic component on the paste-like bonding material; and a curing process of curing the paste-like bonding material and forming the bonding material, wherein the mounting portion includes the bonding region to which the electronic component is bonded, wherein the bonding region includes a corner portion overlapped with corners of the electronic component when seen in the thickness direction, and wherein the paste-like bonding material is applied starting from a central part of the electronic component toward the corner portion at least up until the corner portion.

The invention claimed is:

1. An electronic device, comprising:

an electronic component having an element front surface and an element back surface separated from each other in a thickness direction;

a mounting portion which has a mounting surface opposed to the element back surface and on which the electronic component is mounted; and a bonding material to bond the electronic component to the mounting portion, wherein the bonding material includes a base portion held between the electronic component and the mounting portion in the thickness direction, and a fillet portion connected to the base portion and formed outside the electronic component when seen in the thickness direction, wherein the electronic component includes a first element lateral surface and a second element lateral surface each of which is continuous to the element front surface and the element back surface, and a ridge which is an intersection of the first element lateral surface and the second element lateral surface and extends in the thickness direction, wherein the fillet portion includes a ridge cover portion which at least covers a part of the ridge, and a first cover portion to cover at least a part of the first element lateral surface, wherein the first cover portion is continuous to the ridge cover portion, and wherein, as to the first cover portion, a dimension in the thickness direction of a central portion as viewed in a second direction orthogonal to the second element lateral surface is smaller than a dimension in the thickness direction of a peripheral end continuous to the ridge cover portion, and the first cover portion has a profile such that the dimension in the thickness direction gradually changes starting from the central portion up to the peripheral end.

2. The electronic device according to claim 1, wherein the fillet portion further includes a second cover portion to cover at least a part of the second element lateral surface, and wherein the second cover portion is continuous to the ridge cover portion.

3. The electronic device according to claim 2, wherein on the first element lateral surface, a peripheral end continuous to the element front surface is exposed from the first cover portion when seen in a first direction orthogonal to the first element lateral surface, and wherein on the second element lateral surface, a peripheral end continuous to the element front surface is exposed from the second cover portion when seen in the second direction.

4. The electronic device according to claim 3, wherein the electronic component is rectangular when seen in the thickness direction, and wherein the thickness direction, the first direction, and the second direction are orthogonal to one another.

5. The electronic device according to claim 4, wherein the electronic component further comprises a third element lateral surface, a fourth element lateral surface, and a plurality of additional ridges, wherein the third element lateral surface is continuous to the element front surface and the element back surface and is separated from the first element lateral surface in the first direction, wherein the fourth element lateral surface is continuous to the element front surface and the element back surface and is separated from the second element lateral surface in the second direction, wherein the plurality of additional ridges exist at an intersection of the first element lateral surface and the fourth element lateral surface, an intersection of the second element lateral surface and the third element lateral surface, and an intersection of the third element lateral surface and the fourth element lateral surface, respectively, and each of them extend in the thickness direction, and wherein the fillet portion further includes a plurality of additional ridge cover portions to cover the plurality of additional ridges.

6. The electronic device according to claim 4, wherein the first cover portion has an elevation portion elevated toward an element front surface side between a central portion in the second direction and a peripheral end continuous to the ridge cover portion.

7. The electronic device according to claim 4,
wherein, as to the first cover portion, a central portion in the second direction is recessed toward a first element lateral surface side when seen in the thickness direction.

8. The electronic device according to claim 4,
wherein, as to the first cover portion, a degree of inclination with respect to the mounting surface of a peripheral end continuous to the ridge cover portion is larger than a degree of inclination with respect to the mounting surface of a central portion in the second direction.

9. The electric device according claim 4,
wherein, as to the second cover portion, a dimension in the thickness direction of a central portion as viewed in the first direction is smaller than a dimension in the thickness direction of a peripheral end continuous to the ridge cover portion.

10. The electronic device according to claim 4,
wherein the second cover portion has an elevation portion elevated toward an element front surface side between a central portion in the first direction and a peripheral end continuous to the ridge cover portion.

11. The electronic device according to claim 4,
herein, as to the second cover portion, a central portion in the first direction is recessed toward a second element lateral surface side when seen in the thickness direction.

12. The electronic device according to claim 4,
wherein, as to the second cover portion, a degree of inclination with respect to the mounting surface of a peripheral end continuous to the ridge cover portion is larger than a degree of inclination with respect to the mounting surface of a central portion in the first direction.

13. The electronic device according to claim 1,
wherein the fillet portion is formed all around the electronic component when seen in the thickness direction.

14. The electronic device according to claim 1,
wherein the electronic component is made of a semiconductor material.

15. The electronic device according to claim 1,
wherein, as to the electronic component, a front surface electrode is formed on the element front surface,
wherein the mounting portion is a part of the lead frame, and
wherein the lead frame is conducted to the front surface electrode, and further includes a terminal portion that is separated from the mounting portion.

16. The electronic device according to claim 15,
wherein a constituting material of the lead frame is a metal containing Cu.

17. The electronic device according to claim 1,
wherein, as to the electronic component, a back surface electrode is formed on the element back surface, and
wherein the back surface electrode is conducted to the mounting portion via the bonding material.

18. The electronic device according to claim 1,
wherein the bonding material is made of sintered silver.

19. A method for manufacturing an electronic device comprising an electronic component having an element front surface and an element back surface separated from each other in a thickness direction, a mounting portion which has a mounting surface opposed to the element back surface and on which the electronic component is mounted, and a bonding material to bond the electronic component to the mounting portion, the method comprising:

an application process of applying a paste-like bonding material to the mounting surface;

a placement process of arranging the electronic component on the paste-like bonding material; and a curing process of curing the paste-like bonding material and forming the bonding material, wherein the mounting portion includes the bonding region to which the electronic component is bonded, wherein the bonding region includes a corner portion overlapped with corners of the electronic component when seen in the thickness direction, wherein the paste-like bonding material is applied starting from a central part of the electronic component toward the corner portion at least up until the corner portion, wherein the paste-like bonding material is spread by a placement of the electronic component, wherein a dimension in the thickness direction of a central portion of the paste-like bonding material as viewed in a direction orthogonal to the thickness direction is smaller than a dimension in the thickness direction of a peripheral end, and wherein the paste-like bonding material is shaped to include a portion where the dimension in the thickness direction gradually changes starting from the central portion up until the peripheral end.

* * * * *